United States Patent [19]

Mori et al.

[11] Patent Number: 5,713,660
[45] Date of Patent: Feb. 3, 1998

[54] ILLUMINATION OPTICAL APPARATUS

[75] Inventors: Takashi Mori; Hideki Komatsuda, both of Kawasaki; Noriaki Yamamoto, Kitakatsushika-gun, all of Japan

[73] Assignee: Nikon Corporation, Japan

[21] Appl. No.: 334,665

[22] Filed: Nov. 4, 1994

[30] Foreign Application Priority Data

Nov. 10, 1993 [JP] Japan ................................ 5-280789
Dec. 7, 1993 [JP] Japan ................................ 5-306266

[51] Int. Cl.$^6$ ........................................ F21V 5/04
[52] U.S. Cl. .................... 362/268; 362/331; 353/38; 355/67; 355/53
[58] Field of Search ........................ 362/268, 328, 362/335, 331; 359/621, 385, 789; 355/67, 53, 70, 71; 353/38, 101, 202, 98

[56] References Cited

U.S. PATENT DOCUMENTS

| | | | |
|---|---|---|---|
| 3,296,923 | 1/1967 | Miles et al. | |
| 3,941,475 | 3/1976 | Sheets | 362/268 X |
| 4,497,015 | 1/1985 | Konno et al. | 2362/268 |
| 4,717,242 | 1/1988 | Echizen et al. | 362/268 X |
| 5,005,959 | 4/1991 | Nagata et al. | 362/268 X |
| 5,046,838 | 9/1991 | Iwasaki | 362/268 X |
| 5,418,583 | 5/1995 | Masumoto | 362/268 X |

*Primary Examiner*—Ira S. Lazarus
*Assistant Examiner*—Thomas M. Sember
*Attorney, Agent, or Firm*—Pennie & Edmonds

[57] ABSTRACT

An illumination optical apparatus according to the present invention comprises a light source, a collector mirror having an ellipsoidal surface of revolution for reflecting and collecting light from the light source, a collimator lens for converting the light collected by the collector mirror into nearly parallel beams, an optical integrator for producing a plurality of light source images from the beams outgoing from the collimator lens, and a condenser lens for condensing light from the plurality of light source images to illuminate a body to be illuminated in a superimposed manner. Wherein the collimator lens is arranged to satisfy the following condition, $R_{max} < f_{col} \sin u_{max}$; where $f_{col}$ is a focal length of the condenser lens, $u_{max}$ a maximum angle of incidence of the light incident into the collimator lens, and $R_{max}$ a maximum beam radius of the nearly parallel beams collimated by the collimator lens.

10 Claims, 13 Drawing Sheets

Fig. 8
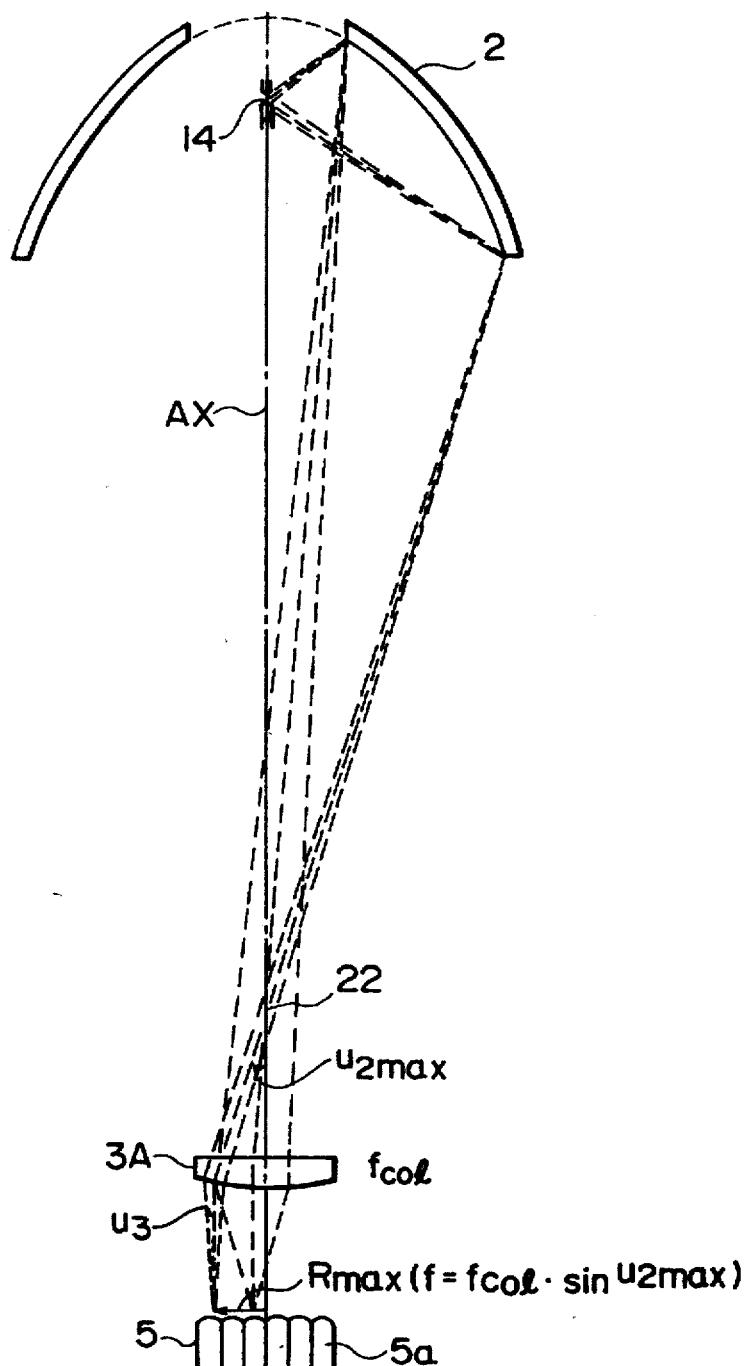
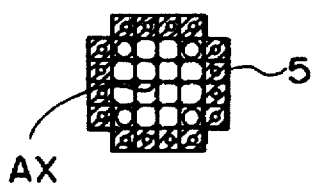

ILLUMINATION OPTICAL APPARATUS

BACKGROUND OF THE INVENTION

1. Field of the Invention

The present invention relates to an illumination optical apparatus for illuminating a body to be illuminated. More particularly, the invention relates to an illumination optical apparatus suitably used for illuminating a reticle on which a pattern for transfer is formed, for example, in exposure apparatus for fabricating semiconductor devices, liquid crystal display devices, etc.

2. Related Background Art

For fabricating, for example, semiconductor devices, liquid crystal display devices, etc. by the photolithography process, there are used projection exposure apparatus which transfer a transfer pattern formed on a photomask or a reticle (hereinafter called totally as "reticle") onto a photosensitive substrate through a projection optical system under predetermined illumination conditions, proximity-type exposure apparatus which directly transfer the pattern on reticle onto the photosensitive substrate located in the proximity of the reticle, or other exposure apparatus. Because of a need to reduce unevenness of exposure amount on the photosensitive substrate, such exposure apparatus (hereinafter referred to as "semiconductor exposure apparatus") employ an illumination optical apparatus using an optical integrator to illuminate a predetermined illumination region on the reticle with as uniform illuminance as possible.

FIG. 1 shows an illumination optical apparatus used in conventional semiconductor exposure apparatus. In FIG. 1, a mercury lamp 1 as a light source is located at a first focal point 21 of a collector mirror 2 having a reflective surface which is of an ellipsoidal surface of revolution, so that a light source image (secondary light source) is formed at a second focal point 22 of the collector mirror 2. Beams diverging from this secondary light source are converted into nearly parallel beams by a collimator lens 3 and then the collimated beams enter a band-pass filter 4. Then illumination light with an exposure wavelength selected by the band-pass filter 4 (the g-line of mercury, i.e., the wavelength of 436 nm; the i-line, i.e., the wavelength of 365 nm; etc.) is incident into a fly's eye lens 5 consisting of a lot of lens elements, so that a lot of light source images (tertiary light sources) are formed on an exit focal plane 52 of the fly's eye lens 5. An aperture stop 6 is set on the focal plane 52 and beams diverging from the numerous tertiary light sources inside the aperture in the aperture stop 6 are condensed by a condenser lens 7 to illuminate with uniform illuminance in a superimposed manner an illumination region 8 on a pattern-formed surface of reticle in which an exposure pattern is drawn. In FIG. 1, the Z-axis is taken in parallel with the optical axis of the illumination optical apparatus, the X-axis is taken perpendicular to the Z-axis and parallel with the plane of FIG. 1, and the Y-axis is taken perpendicular to the plane of FIG. 1.

In this case, the light source 1 is optically conjugate, as described above, with the second focal point 22 of collector mirror 2 and with the exit focal plane 52 of fly's eye lens 5, and a numerical aperture (NA) of the illumination system on the illumination region 8 as a surface to be illuminated is determined by an aperture diameter of the aperture stop 6 set on the focal plane 52. Since the numerical aperture of illumination system greatly affects the resolution of projected image, the depth of focus, the quality of image, etc., it must be set to an optimum value in accordance with a numerical aperture of projection optical system, the pattern dimensions, etc. Also, the illuminated surface where the illumination region 8 is located (the pattern-formed surface of reticle) is conjugate with the entrance focal plane 51 of fly's eye lens 5, so that an entrance plane of each of lens elements constituting the fly's eye lens 5 serves as a field stop. Beams limited by the field stops are guided through the condenser lens 7 to be superimposed on the illuminated surface.

Accordingly, the cross section of the lens elements constituting the fly's eye lens 5 is determined as similar to the shape of illumination region 8. With the semiconductor exposure apparatus, a pattern is generally formed in a rectangular region on the reticle, and therefore the illumination region 8 is also a rectangular region of X-directional length Mx and Y-directional length My. Thus, the fly's eye lens 5 is constructed in such a manner that lens elements of rectangular cross section are densely combined to have a spread including the maximum aperture diameter of aperture stop 6.

FIG. 2 is a view along the Z-direction, of the thus constructed fly's eye lens 5, and FIG. 3 is a side view of the fly's eye lens 5. As shown in FIG. 2, the fly's eye lens 5 is composed of a lot of lens elements 5a each with a rectangular cross section of X-directional length mx and Y-directional length my, as being arranged in close fit in the X direction and Y direction. The maximum aperture shown by a circle of solid line in the aperture stop 6 is within the contour of the cross section of the fly's eye lens 5.

Returning to FIG. 1, supposing the collimator lens 3, the fly's eye lens 5, and the condenser lens 7 each satisfy the sine condition, the below relation (1) holds when the focal length of condenser lens 7 is $f_c$, the focal length of each lens element in the fly's eye lens 5 is $f_F$, the length of an X-directional or Y-directional side of the rectangular illumination region 8 is Mx,y, and the length of an X-directional or Y-directional side of each lens element in the fly's eye lens 5 is mx,y. In the following description, when Mx,y indicates the X-directional length Mx, mx,y also indicates the X-directional length mx; when Mx,y indicates the Y-directional length My, mx,y also indicates the Y-directional length my.

$$Mx, y = mx, y \cdot (f_c/f_F) \quad (1)$$

Also, letting $2R_0$ be the aperture diameter of aperture stop 6 and $NA_{ill}$ be the numerical aperture of illumination system on the illumination region 8, there is the following relation.

$$NA_{ill} = R_0/f_c \quad (2)$$

Therefore, when the length Mx,y and the numerical aperture $NA_{ill}$ are given as specifications of illumination optical system, the focal length $f_c$, mx,y/$f_F$, and the aperture diameter $2R_0$ are determined so as to satisfy the above relations of equations (1) and (2). Also, when the maximum angle of divergence of beams from the secondary light source at the second focal point 22 of collector mirror 2 is $u_{max}$ and the focal length of collimator lens 3 is $f_{col}$, the maximum angle of divergence $u_{2max}$ and the focal length $f_{col}$ are set so as to satisfy the following relation.

$$R_0 = f_{col} \sin u_{2max} \quad (3)$$

More strictly, they are to be set to obtain the diameter of a beam covering the entire fly's eye lens 5 including the aperture diameter $2R_0$.

As described above, setting the specifications $f_c$, mx,y/$f_F$, $2R_0$, $u_{2max}$, and $f_{col}$ with the given specifications of illumination optical system ($mx,y$ and $NA_{ill}$), an illumination optical system can be achieved without a loss in quantity of light between the second focal point 22 of collector mirror 2 and the illumination region 8.

Since the mercury lamp 1 used as a light source in the exposure apparatus of this type has a spread of emission arc as detailed later, the image (secondary light source) by the ellipsoidal surface of revolution of the collector mirror 2 also has a spread. Let $2y_2$ be the diameter of the secondary light source and $2y_3$ be the diameter of the tertiary light sources formed on the exit focal plane 52 of the lens elements in the fly's eye lens 5. Then the following relation holds.

$$y_3 = y_2 \cdot (f_F/f_{col}) \qquad (4)$$

In this case, when the following relation (5) holds, the loss in quantity of light becomes zero, because each of the tertiary light sources drops within the cross section of each lens element.

$$2y_3 \leq mx,y \qquad (5)$$

Here, $mx,y$ in the above equation (5) means the smallest length, either the X-directional length or the Y-directional length. However, if $2y_3$ is larger than $mx,y$, a difference between them becomes projected onto the side surfaces of fly's eye lens 5, thus causing a loss in quantity of light.

Next obtained is a condition for causing no loss in quantity of light. First, the next relation is derived from equation (1).

$$mx,y = Mx,y \cdot (f_F/f_c) \qquad (6)$$

Also, $f_c = R_0/NA_{ill}$ from equation (2) and, using it with equation (3), equation (6) becomes as follows.

$$mx,y = Mx,y \cdot NA_{ill} \cdot (f_F/f_{col}) \cdot (1/\sin u_{2max}) \qquad (7)$$

Consequently, inequality (5) is rewritten as follows.

$$(f_{col}/f_F) \cdot 2y_3 \cdot \sin u_{2max} \leq Mx,y \cdot NA_{ill} \qquad (8)$$

Here, using equation (4), the condition for causing no loss in quantity of light is given by the following.

$$2y_2 \cdot \sin u_{2max} \leq Mx,y \cdot NA_{ill} \qquad (9)$$

Accordingly, when the specifications of illumination optical system ($Mx,y$ and $NA_{ill}$) are given, the condition for causing no loss in quantity of light with an arc spread of the mercury lamp is determined only by a product between the size $2y_2$ of the secondary light source formed by the collector mirror 2 having the ellipsoidal surface of revolution and the maximum angle of divergence $u_{2max}$ from the secondary light source, regardless of the intermediate optical system.

FIG. 4 shows the structure of a short arc mercury lamp used as a light source for illumination optical apparatus of this type. In FIG. 4, the mercury lamp 1 is so arranged that mercury, starting rare gas, and so on are sealed in a quartz bulb 11 and that electrodes 12 and 13 are closely opposed to each other so as to effect discharge emission with application of a dc voltage between them. Thus, the emission arc 14 has a shape of a main spread extending along the axis of electrodes. As described previously, in order to utilize the emission energy of lamp at a high efficiency, it is more advantageous to make the emission arc 14 smaller and brighter, i.e., to make the gap between the electrodes smaller. However, if high power is intended to supply while keeping the gap between the electrodes small, it is general that an electric current amount greatly increases so as to cause electrode wear, an increase in rupture probability, etc. due to a large quantity of Joule heat generated, which will be a great hindrance to the life and reliability in applications as a light source for exposure apparatus of this type. Therefore, the electrode gap cannot be decreased without limitation.

Accordingly, where illumination with high illuminance was required for a narrow illumination region with short length $Mx,y$ (at least either one of $Mx$ and $My$) not satisfying the above inequality (9) or for an extremely small numerical aperture of illumination system $NA_{ill}$, it was general to choose a way of increasing the power of mercury lamp, ignoring the above-described loss in quantity of light.

Conventionally, dominating semiconductor exposure apparatus were reduction projection exposure apparatus (steppers) of the step-and-repeat type in which a full pattern on reticle was projected onto each shot area on a photosensitive substrate to effect full exposure. With the steppers, the length-to-width ratio (aspect ratio) of the illumination region on reticle was not so far away from 1:1 in general and the length $Mx,y$ in the above inequality (9) was not so small. Thus, the loss in quantity of light was also small. Then, the degree of power increase of mercury lamp was moderate heretofore, thus raising no problem in life or reliability in practical use.

There are, however, recent demands of large area exposure for printing a circuit pattern with larger area on reticle onto the photosensitive substrate. Also, simply increasing the exposure field of projection optical system now becomes difficult in respect of design and fabrication. With use of a reflection system as a projection optical system, there are cases where the best image range is an arcuate elongate region. Under such circumstances, attention is being given to exposure apparatus of the so-called step-and-scan type or slit scan type in which a slit illumination region is illuminated on the reticle, the reticle is moved in the transverse direction relative to the illumination region, and in synchronization therewith, exposure is made while scanning each shot area on the photosensitive substrate relative to the exposure area in the illumination region.

In the exposure apparatus of such scan type, the illumination region on the reticle is of an elongate rectangle, so that one of the X-directional length $Mx$ and the Y-directional length $My$ of the illumination region 8 in FIG. 1 becomes considerably shorter than that in the conventional cases. Accordingly, the length $Mx,y$ in the inequality (9) becomes considerably shorter and the loss in quantity of light becomes larger. If the power of mercury lamp were increased to compensate it, problems would occur, for example, too short life of mercury lamp.

Also, there are various reticle illumination methods recently proposed, among which there are some methods with smaller numerical apertures of illumination system $NA_{ill}$ than those in the conventional cases. Further, there is a possibility that an illumination method with an extremely small numerical aperture of illumination system $NA_{ill}$ will be developed. With smaller (or extremely smaller) numerical apertures of illumination system $NA_{ill}$ than those in the conventional cases, the inequality (9) cannot be satisfied. Then, if the power of mercury lamp were increased to compensate it, problems would occur, for example, too short life of mercury lamp.

SUMMARY OF THE INVENTION

In view of the above points, an object of the present invention is to provide an illumination optical apparatus which can illuminate an illumination region on a body to be illuminated with high illumination efficiency and with high illuminance without a need to use a light source of highly increased power even if a narrow illumination region or a small numerical aperture not satisfying the above inequality (9) is given as specifications.

An illumination optical apparatus according to the present invention comprises a light source, a collector mirror having an ellipsoidal surface of revolution for reflecting and collecting light from the light source, a collimator lens for converting the light collected by the collector mirror into nearly parallel beams, an optical integrator for producing a plurality of light source images from the beams outgoing from the collimator lens, and a condenser lens for condensing light from the plurality of light source images to illuminate a body to be illuminated in a superimposed manner, wherein the collimator lens is arranged to satisfy the following condition (A):

$$R_{max} < f_{col} \sin u_{max} \qquad (A)$$

where $f_{col}$ is a focal length of the condenser lens, $u_{max}$ a maximum angle of incidence of the light incident into the collimator lens, and $R_{max}$ a maximum beam radius of the nearly parallel beams collimated by the collimator lens.

Also, another illumination optical apparatus of the present invention comprises a light source, a collector mirror having an ellipsoidal surface of revolution for reflecting and collecting light from the light source, a collimator lens for converting the light collected by the collector mirror into nearly parallel beams, an optical integrator for producing a plurality of light source images from the beams outgoing from the collimator lens, and a condenser lens for condensing light from the plurality of light source images to illuminate a body to be illuminated in a superimposed manner, wherein the collimator lens is arranged substantially to satisfy the following condition (B):

$$R = C_1/\{(\beta^2-1)\cos u - (\beta^2+1)\} + C_2 \qquad (B)$$

where $f_1$ and $f_2$ ($f_1 < f_2$) are distances from the vertex of the ellipsoidal surface of revolution of the collector mirror to the first focal point and to the second focal point, respectively, u an angle of incidence of the light incident into the collimator lens, R a radius of the nearly parallel beams collimated by the collimator lens from the light of the incident angle u, $\beta = f_2/f_1$, and $C_1$ and $C_2$ two arbitrary constants.

In this case, an example of the collimator lens has a lens element at least one surface of which is an aspherical surface.

Still another illumination optical system according to the present invention comprises a collector mirror having an ellipsoidal surface of revolution, a light source located at the first focal point of the collector mirror, a collimating optical system arranged coaxially with the collector mirror, for converting light first emitted from the light source and then reflected and collected by the collector mirror into nearly parallel beams, an optical integrator for producing a plurality of light source images from the beams outgoing from the collimating optical system, and a condenser lens for condensing light from the plurality of light source images to illuminate a body to be illuminated in a superimposed manner, wherein a correction optical system is set between the collector mirror and the collimating optical system, the correction optical system being for focusing light emitted from the vicinity of the first focal point along the optical axis of the collector mirror by the light source provided at the first focal point of the collector mirror, in a predetermined plane perpendicular to the optical axis of the collector mirror to form a real image of the light source thereon.

In this case, where light incident at an angle $u_1$ relative to the optical axis from the light source onto the ellipsoidal surface of revolution of the collector mirror makes an angle $u_3$ with the optical axis when emerging from the correction optical system, the angles $u_1$ and $u_3$ are preferably arranged substantially to satisfy the following condition (C), using a certain negative constant $C_1$ and a certain constant $C_2$.

$$\cos u_1 = C_1 \cdot \sin u_3 + C_2 \qquad (C)$$

Also, an example of the correction optical system is an optical system having a lens element at least one surface of which is aspherical.

Also, another illumination optical system of the present invention comprises a collector mirror having an ellipsoidal surface of revolution, a light source located at the first focal point of the collector mirror, and a correction optical system for focusing light emitted from the vicinity of the first focal point along the optical axis of the collector mirror by the light source, in a predetermined plane perpendicular to the optical axis of the collector mirror to form a real image of the light source.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 8 is a drawing to show an example of ray diagram when the inequality (9) does not hold;

FIG. 9 is a drawing to show a state of tertiary light sources;

DESCRIPTION OF THE PREFERRED EMBODIMENTS

Embodiment 1

Described below is embodiment 1 of the illumination optical apparatus according to the present invention. First, the principle is described.

Figure 6:
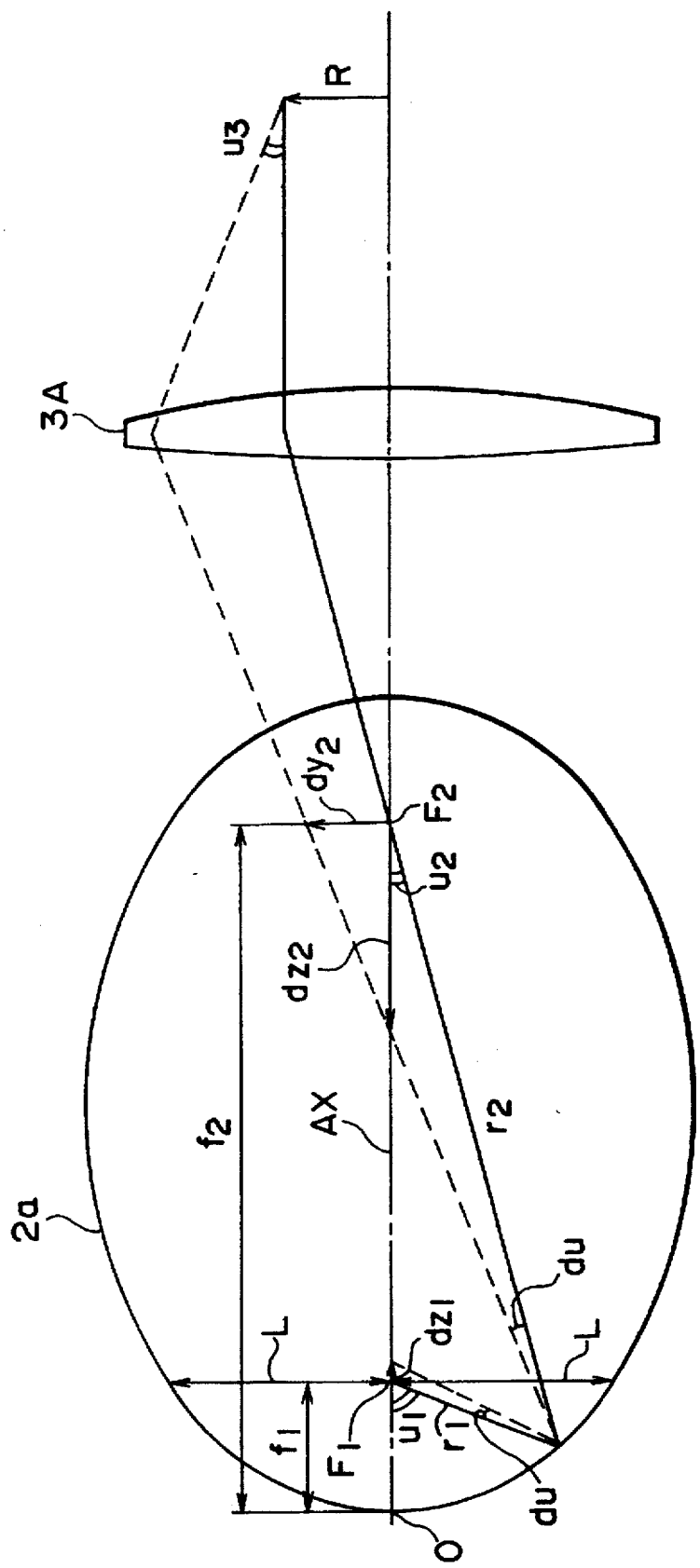
FIG. 6 is a drawing to illustrate imaging characteristics of an ellipsoidal surface of revolution 2a of a collector mirror 2 shown in FIG. 5.

Note the geometric property owned by an ellipsoidal surface of revolution of a collector mirror 2. As shown in FIG. 6, the ellipsoidal surface of revolution $2a$ of the collector mirror 2 is a locus of points where a sum $(r_1+r_2)$ of a distance $r_1$ from the first focal point $F_1$ and a distance $r_2$ from the second focal point $F_2$ is constant, and therefore the ellipsoidal surface of revolution $2a$ has the important optical property that there is no spherical aberration at the two focal points $F_1$ and $F_2$.

As shown in FIG. 6, suppose in a plane including the axis passing the two focal points $F_1$, $F_2$ (as will be referred to as "optical axis AX") light starts at an angle $u_1$ relative to the optical axis AX from the focal point $F_1$ toward the ellipsoidal surface of revolution $2a$ and is reflected thereby to travel toward the focal point $F_2$. Then, letting $u_2$ be an angle of the light relative to the optical axis AX and $2L$ be the latus rectum of ellipse, and using the eccentricity e, the ellipse of the ellipsoidal surface of revolution $2a$ can be expressed in the following polar form.

$$r_1 = L/(1+e \cdot \cos u_1) \quad (10\text{-}1)$$

$$r_2 = L/(1-e \cdot \cos u_2) \quad (10\text{-}2)$$

Here, letting $f_1$ and $f_2$ be distances from the vertex O of the ellipse to the two focal points $F_1$ and $F_2$, respectively, the latus rectum $2L$ and the eccentricity e can be expressed as follows.

$$L = 2f_1 f_2/(f_1+f_2) \quad (10\text{-}3)$$

$$e = (f_2-f_1)/(f_1+f_2) \quad (10\text{-}4)$$

Then the following equation can be obtained.

$$r_1 = 2f_1 f_2/\{(f_1+f_2)+(f_2-f_1) \cos u_1\} \quad (11\text{-}1)$$

In this case, because $r_2 = f_1+f_2-r_1$, the following equation is obtained for $r_2$, using equation (11-1).

$$r_2 = \{(f_1^2+f_2^2)+(f_2^2-f_1^2) \cos u_1\}/\{(f_1+f_2)+(f_2-f_1) \cos u_1\} \quad (11\text{-}2)$$

Defining a paraxial lateral magnification $\beta$ of the ellipsoidal surface of revolution $2a$ as $\beta = f_2/f_1$, the following equations are obtained by arranging equations (11-1) and (11-2).

$$r_1 = 2f_2/\{(\beta+1)+(\beta-1) \cos u_1\} \quad (12\text{-}1)$$

$$r_2 = f_1\{(\beta^2+1)+(\beta^2-1) \cos u_1\}/\{(\beta+1)+(\beta-1) \cos u_1\} \quad (12\text{-}2)$$

From equations (10-2) and (12-2), the following relation is derived.

$$\cos u_2 = \{(\beta^2-1)+(\beta^2+1) \cos u_1\}/\{(\beta^2+1)+(\beta^2-1) \cos u_1\} \quad (12\text{-}3)$$

In this case, because $\sin u_2 = (1-\cos^2 u_2)^{1/2}$, the following relation is obtained.

$$\sin u_2 = 2\beta \sin u_1 /\{(\beta^2+1)+(\beta^2-1) \cos u_1\} \quad (12\text{-}4)$$

Here, from equation (12-4), the following amount $\Delta$ not satisfying the sine condition, of the ellipsoidal surface of revolution $2a$ is obtained.

$$\begin{aligned}\Delta &= \beta - (\sin u_1/\sin u_2) \\ &= \beta - \{(\beta^2+1)+(\beta^2-1)\cos u_1\}/2\beta\end{aligned} \quad (12\text{-}5)$$

This amount $\Delta$ not satisfying the sine condition, of the ellipsoidal surface of revolution $2a$ increases its absolute value as the angle $u_1$ increases. The present invention is based on the fact that the ellipsoidal surface of revolution $2a$ is not aplanatic in image formation, because it does not satisfy the sine condition though there is no spherical aberration between the two focal points on the ellipsoidal surface of revolution $2a$.

Under the above preconditions, let us consider a spread at the second focal point $F_2$, of an image of a light source having a spread along the optical axis AX while placed at the first focal point $F_1$ of the ellipsoidal surface of revolution $2a$ of the collector mirror 2. As shown in FIG. 6, let $dz_1$ be an infinitesimal change along the optical axis, of the light source at the first focal point $F_1$, du be an infinitesimal angle viewing the range of $dz_1$ from the ellipsoidal surface of revolution $2a$, $dz_2$ be a change along the optical axis, of the light source image with respect to the second focal point $F_2$, and $dy_2$ be a lateral infinitesimal change of the light source image with respect to the second focal point $F_2$. Then the following relations hold.

$$dz_1 \cdot \sin u_1 = r_1 \cdot du \quad (13\text{-}1)$$

$$-dz_2 \cdot \sin u_2 = r_2 \cdot du \quad (13\text{-}2)$$

$$dy_2 = -dz_2 \cdot \tan u_2 \quad (13\text{-}3)$$

Eliminating the infinitesimal angle du from these equations, the following equation is obtained.

$$dy_2/dz_2 = r_2 \cdot \sin u_1/(r_1 \cdot \cos u_2) \quad (13\text{-}4)$$

Substituting equation (12-1) to equation (12-4) into equation (13-4) and arranging it, a "magnification B of a lateral spread of the light source image at the second focal point $F_2$ relative to an axial spread of the light source" (as will be referred to as lateral spread magnification B) is given as follows.

$$B = dy_2/dz_1 \qquad (14)$$
$$= (\sin u_1/2\beta) \cdot \{(\beta^2 + 1) + (\beta^2 - 1)\cos u_1\}^2/$$
$$\{(\beta^2 - 1) + (\beta^2 + 1)\cos u_1\}$$

Figure 4:
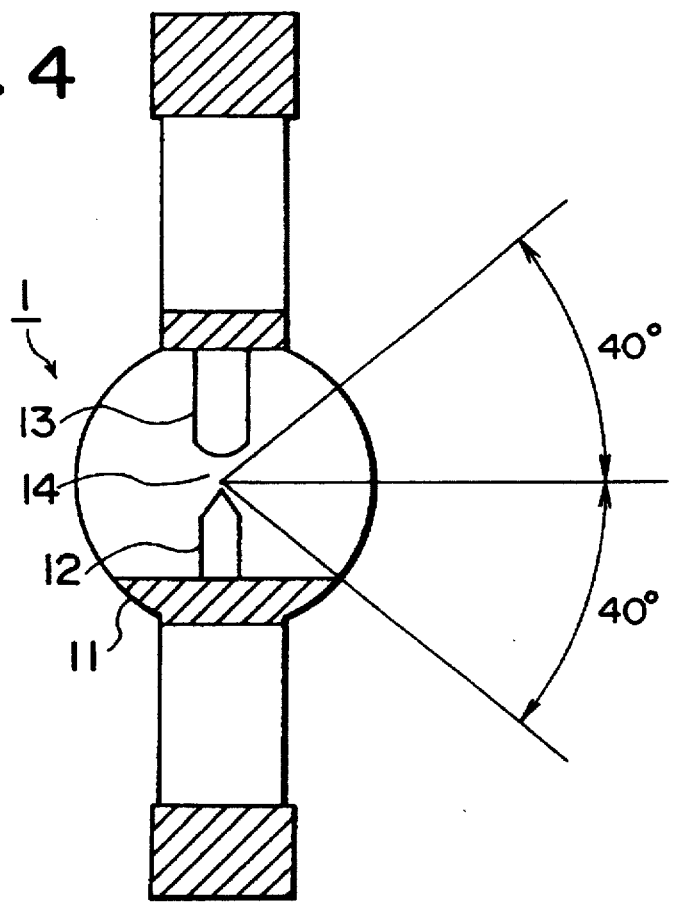
FIG. 4 is an enlarged drawing to show a mercury lamp 1.
Figure 7:
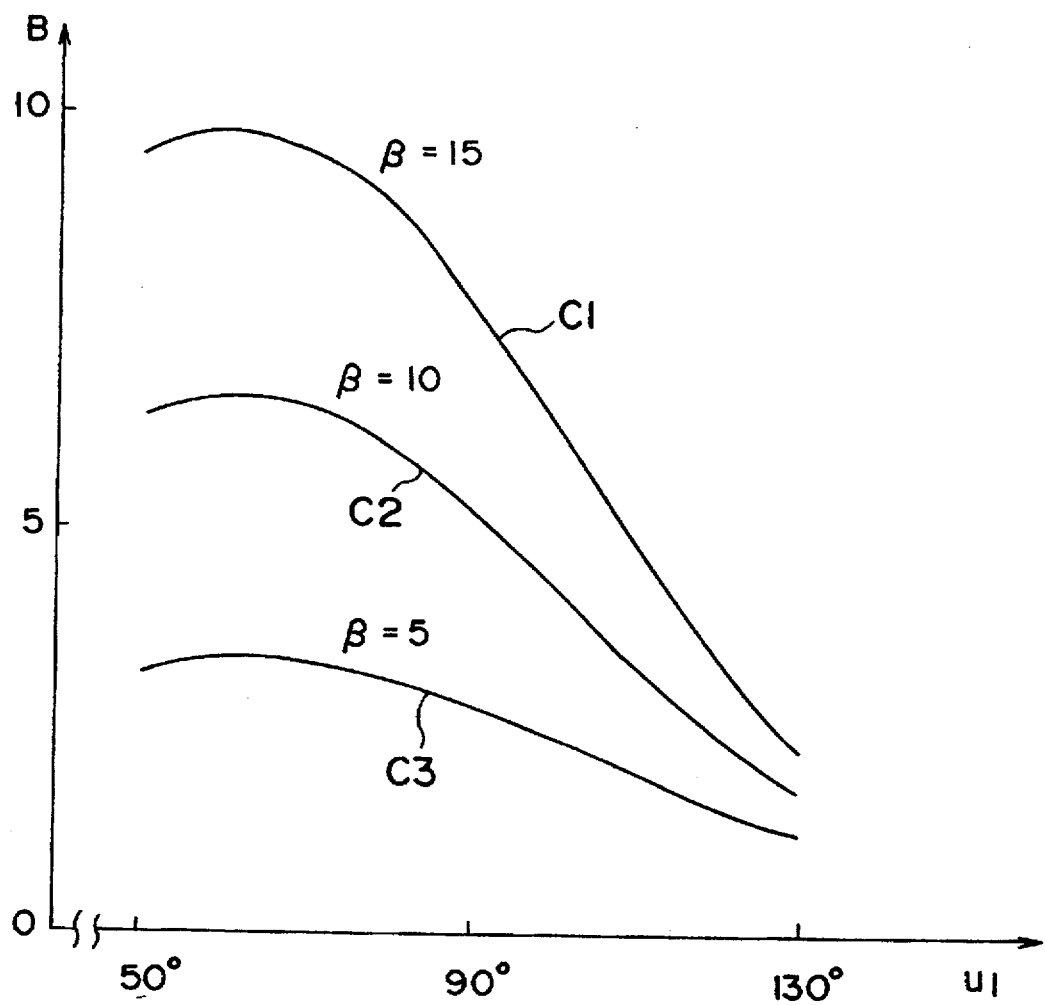
FIG. 7 is a drawing to show relations of lateral spread magnification B against angle $u_1$ in FIG. 6.

When the mercury lamp 1 shown in FIG. 4 is used as a light source, the light emitted from the mercury lamp 1 is distributed in the range of about ±40° with the center approximately at the angle $u_1=90°$ (or in the range of $u_1=50°$ to 130°). FIG. 7 shows calculation results of the lateral spread magnification B for various paraxial lateral magnifications $\beta$ (=$f_2/f_1$) against angles $u_1$ in the angular range. In FIG. 7, curves C1, C2, and C3 indicate calculation results when values of the paraxial lateral magnification $\beta$ are 15, 10, and 5, respectively. There is such a tendency that the lateral spread magnification B takes larger values with smaller angles $u_1$ (taking a maximum value near $u_1=60°$ in either case) and takes a minimum value at $u_1=130°$. Accordingly, where the illumination optical system is constructed in the range not satisfying the inequality (9) by the conventional method as described previously, the efficiency will be degraded from the side of smaller angles $u_1$.

Now, the conventional problem of causing a reduction in illumination efficiency is specifically described referring to FIG. 8.

Figure 1:
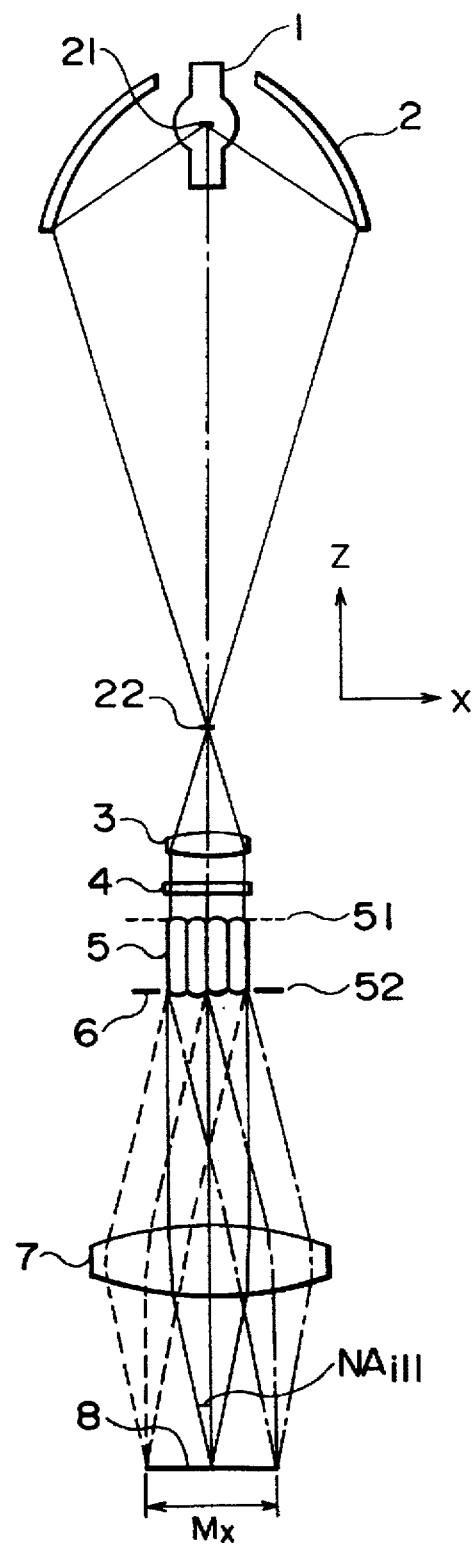
FIG. 1 is a drawing to show the structure of a conventional illumination optical apparatus.
Figure 2:
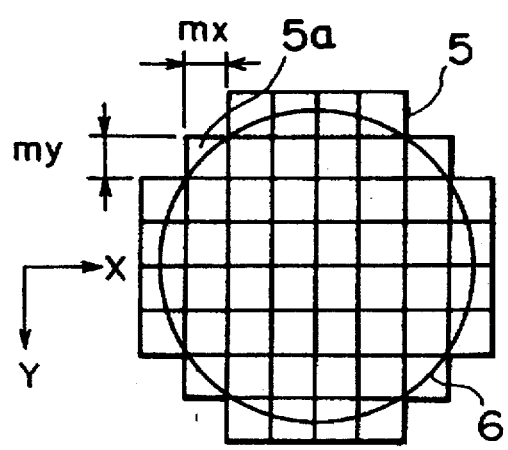
FIG. 2 is a drawing to show a fly's eye lens 5 shown in FIG. 1, as seen along the optical axis.
Figure 3:
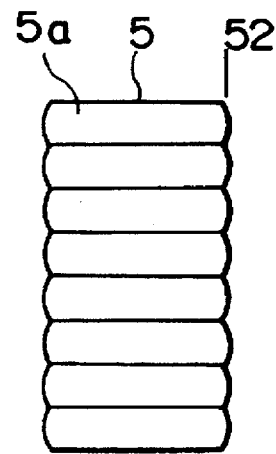
FIG. 3 is a side view of the fly's eye lens 5 shown in FIG. 1.

FIGS. 8 and 9 show an example where the illumination region 8 in FIG. 1 is a square region, and either where the overall numerical aperture of illumination system $NA_{ill}$ is so small as not to satisfy the above inequality (9) or where the length Mx,y (Mx or My) of each side of the square illumination region 8 is so small as not to satisfy the above inequality (9). FIG. 8 shows a state of rays traveling from the emission arc 14 of mercury lamp to the fly's eye lens 5 as an optical integrator, and FIG. 9 shows a state of tertiary light sources formed on the exit plane of fly's eye lens 5.

As shown in FIG. 8, because of the property of the elliptic mirror as represented by the equation of the lateral spread magnification B, i.e., by equation (14), the numerical apertures of beams incident into lens elements 5a in the fly's eye lens 5 near the optical axis AX are greater than those of beams incident into lens elements in the fly's eye lens 5 away from the optical axis AX. Because of this, part of beams incident with larger numerical apertures into the lens elements 5a near the optical axis AX (rays having larger numerical apertures) hit the internal surfaces of the lens elements 5a in the fly's eye lens 5, thereby causing a loss in quantity of light.

Next, in FIG. 6, a beam incident at an angle $u_2$ into the second focal point $F_2$ is incident at an angle of incidence $u_2$ into the collimator lens 3A and the light of the incident angle $u_2$ is collimated into parallel light by the collimator lens 3A. Here, let R be the height of the parallel light from the optical axis (or the radius of the parallel light). In this case, the previously described illumination efficiency can be improved in the region where the incident angle $u_2$ is small or where the emission angle $u_1$ is small, if the focal length $f_{col}$ of collimator lens 3A according to equation (4) is taken so as to satisfy equation (5).

However, the following problem would occur if the focal length of collimator lens 3A is simply increased.

Figure 10:
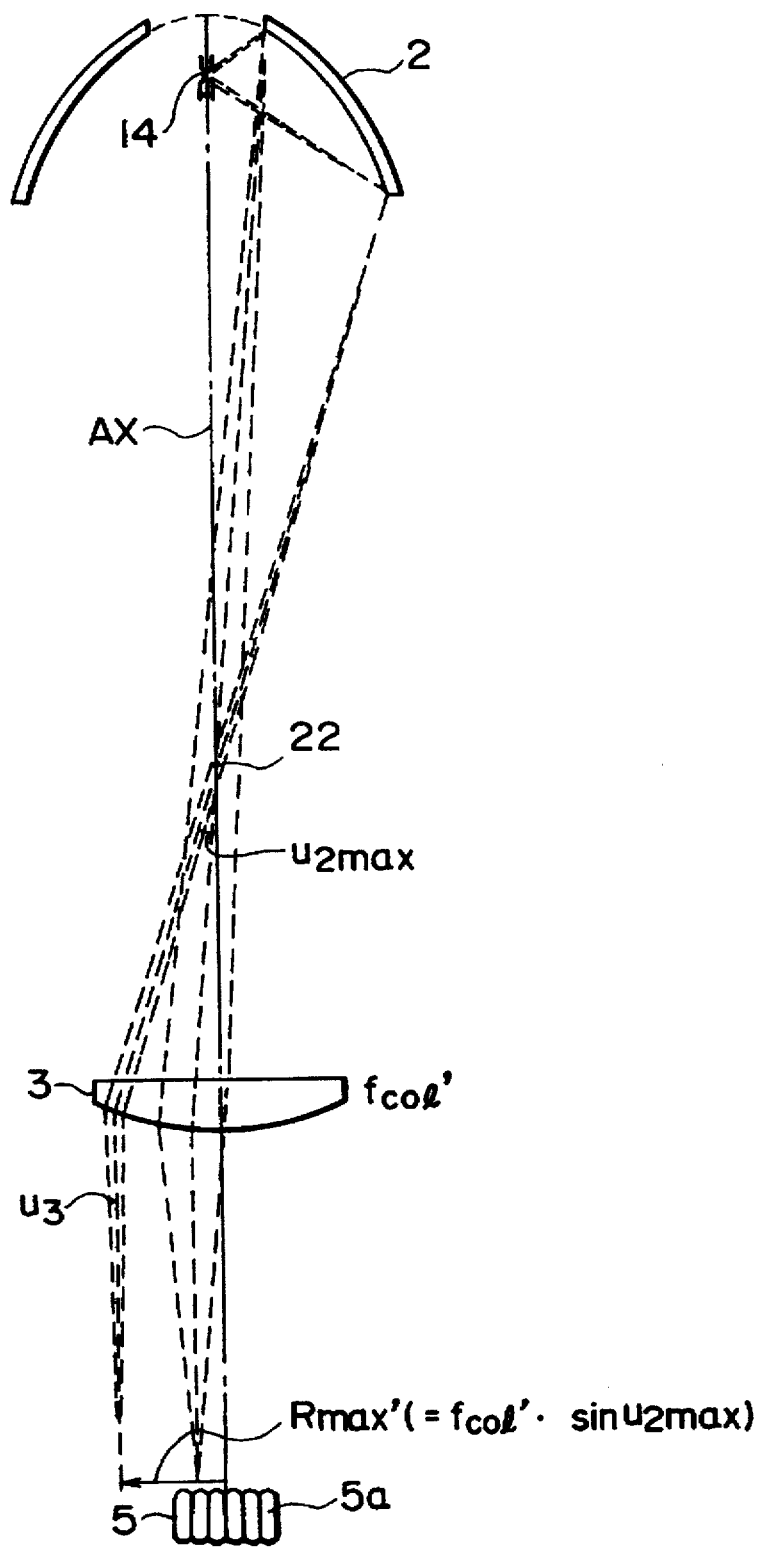
FIG. 10 is a drawing to show another example of ray diagram when the inequality (9) does not hold.

Now, let $R_{max}$ be a height of parallel light from the optical axis (or a maximum radius of parallel light) when light of maximum incident angle $u_{2max}$ is collimated by the collimator lens 3A, and $R_0$ be a maximum radius of beams effectively captured after limited by the size of the optical integrator 5 on this occasion (or the aperture radius of aperture stop 6). Then, increasing the focal length $f_{col}$ of collimator lens 3A to $f_{col}'$, as shown in FIG. 10, the maximum radius $R_{max}$ of parallel light also increases therewith to $R_{max}'$. The maximum radium $R_{max}'$ of parallel light in this case exceeds the maximum radius $R_0$ of beams effectively captured by the optical integrator 5, so that any beams in the region of larger angles $u_2$ are not taken into the optical integrator 5, thus causing a loss in quantity of light. This state is represented by the following equation in comparison with equation (3).

$$R_{max}=R_0<f_{col}'\cdot\sin u_{2max}=R_{max}' \qquad (15)$$

FIG. 10 shows a case in which the focal length of collimator lens 3A is simply increased where the illumination region 8 in FIG. 1 is a square region and either where the overall numerical aperture of illumination system $NA_{ill}$ is so small as not to satisfy the above inequality (9) or where the length Mx,y (Mx or My) of each side of the square illumination region 8 is so small as not to satisfy the above inequality (9) (which is the state shown in FIG. 8).

Then, let us study how to solve the problem of the loss in quantity of light with an increase in focal length of collimator lens 3A, as shown by equation (15).

Let $u_2$ be an angle of incidence of a principal ray incident into the collimator lens 3A after passing the second focal point $F_2$ of the elliptic mirror 2, R be a height of an image (height of image from the optical axis) converged and focused by the collimator lens 3A from the beam including the principal ray (which is the ray passing the second focal point $F_2$ of the elliptic mirror 2) incident at the incident angle $u_2$ into the collimator lens 3A, in other words, a height from the optical axis, of the parallel light (or a radius of the parallel light) collimated by the collimator lens 3A from the parallel light incident at the incident angle $u_2$ into the collimator lens 3A, and $G(u_2)$ be a predetermined function for the incident angle $u_2$. Then the projection relation in this case is given by the following equation.

$$R=f_{col}'G(u_2) \qquad (16\text{-}1)$$

Then, in order to overcome the problem of loss in quantity of light with an increase in focal length of collimator lens 3A, the following relations must be satisfied.

$$f_{col}<f_{col}' \qquad (16\text{-}2)$$

$$f_{col}'G(u_{2max})=R_0=R_{max} \qquad (16\text{-}3)$$

From equation (5), equation (16-2), and equation (16-3), the following relation is derived.

$$G(u_{2max})/(f_{col}\cdot\sin u_{2max})=f_{col}/f_{col}'<1 \qquad (16\text{-}4)$$

Finally, the following relation is derived.

$$G(u_{2max})<\sin u_{2max} \qquad (16\text{-}5)$$

Multiplying the both sides of equation (16-5) by $f_{col}'$, the following equation is obtained.

$$f_{col}'G(u_{2max})<f_{col}'\sin u_{2max} \qquad (16\text{-}6)$$

From the relations of equation (15) and (16-3), equation (16-6) becomes as follows.

$$R_{max}=f_{col}'G(u_{2max})<f_{col}'\sin u_{2max} \qquad (16\text{-}7)$$

Accordingly, equation (16-7) can be rewritten by changing $f_{col}'$ into $f_{col}$ and $u_{2max}$ into $u_{max}$, whereby the following equation, which is the same as the condition (A), is finally obtained.

$$R_{max} = f_{col} G(u_{max}) \cdot f_{col} \sin u_{max} \qquad (16\text{-}8)$$

As described above, when equation (16-8) is satisfied, a loss in quantity of light is small in the region where the incident angle $u_2$ into the collimator lens 3A is large. In addition, the illumination efficiency is considerably improved in the region where the emission angle $u_1$ from the mercury lamp 1 is small.

Further considered in detail is the function $G(u_2)$ defining the projection relation of collimator lens 3A for achieving the above object. For convenience of description, the optical integrator 5 is assumed to be a fly's eye lens, where the length of a side of the cross section of each lens element in the fly's eye lens 5 is mx,y and the focal length of each lens element is $f_F$. In this case, the condition for no loss in quantity of light in the fly's eye lens 5, equation (5), becomes as follows using equation (4).

$$mx, y/2 f_F \geq y_2/f_{col} = \sin u_3 \qquad (17)$$

Here, $\sin u_3$ in the right side is a numerical aperture of a focused beam when the collimator lens 3A focuses a beam including the principal ray (the ray passing the second focal point $F_2$ of the elliptic mirror 2) incident at the incident angle $u_2$ into the collimator lens 3A. This numerical aperture ($\sin u_3$) is given by a function $S(u_2)$ of the incident angle $u_2$ of the principal ray incident into the collimator lens 3A. That is, the following relation of equation (18) holds.

$$S(u_2) = \sin u_3 \qquad (18)$$

Here, letting $u_2$ be the incident angle of the principal ray incident into the collimator lens 3A after passing the second focal point $F_2$ of the elliptic mirror 2, and further letting $y_2$ be a height of an image converged and focused by the collimator lens 3A from the beam including the principal ray (the ray passing the second focal point $F_2$ of the elliptic mirror 2) incident at the incident angle $u_2$ into the collimator lens 3A (or a height of the image from the optical axis), in other words, letting $y_2$ be a half of the size of the secondary light source formed at the second focal point $F_2$ of the elliptic mirror 2, the projection relation on this occasion is expressed by the following expression different from equation (16-1).

$$y_2 = g(u_2) \qquad (19)$$

Then the following relation of differential equation holds.

$$S(u_2) = dy_2 \cos u_2/g'(u_2) \qquad (20)$$

In the above equation, $g'(u_2)$ is a differential (derivative) of the function $g(u_2)$, that is, $g'(u_2) = dg(u_2)/du_2$. On the other hand, the following relation holds from equation (12-3).

$$\cos u_1 = \{(\beta^2-1)-(\beta^2+1) \cos u_2\}/\{(\beta^2-1) \cos u_2-(\beta^2+1)\} \qquad (21\text{-}1)$$

Here, because $\sin u_1 = (1-\cos^2 u_1)^{1/2}$ holds, the following equation is derived.

$$\sin u_1 = 2\beta \sin u_2/\{(\beta^2-1) \cos u_2-(\beta^2+1)\} \qquad (22\text{-}2)$$

Substituting this equation into equation (14), the following equation is obtained.

$$B = dy_2/dz_1 \qquad (23)$$
$$= 4\beta^2 \tan u_2/\{(\beta^2-1) \cos u_2-(\beta^2+1)\}^2$$

Substituting equation (23) into equation (20), the following equation is obtained.

$$S(u_2)/dz_1 = 4\beta^2 \sin u_2/\{(\beta^2-1) \cos u_2-(\beta^2+1)\}^2 g'(u_2) \qquad (24)$$

Here, employing a function $g(u_2)$ satisfying the following relations:

$$S(u_2)/dz_1 = C = \text{constant} \neq 0 \qquad (25\text{-}1)$$
$$u_2 \neq 0 \qquad (25\text{-}2),$$

the loss in quantity of light of the optical integrator 5 due to the spread of light source 1 along the optical axis becomes constant irrespective of the angle $u_1$ indicating the direction of emission, and the illumination efficiency becomes maximum. Substituting equation (25-1) and equation (25-2) into equation (24), the following differential equation is obtained.

$$g'(u_2) = (1/C) 4\beta^2 \sin u_2/\{(\beta^2-1) \cos u_2-(\beta^2+1)\}^2 \qquad (26)$$

This differential equation can be easily solved. Employing constants $C_1$ and $C_2$, a function $g(u_2)$ satisfying equation (26) may be given by the following.

$$g(u_2) = C_1/\{(\beta^2-1) \cos u_2-(\beta^2+1)\} + C_2 \qquad (27)$$

When this function $g(u_2)$ is substituted into equation (19) and the image height $y_2$ is replaced by R, the previously described condition (B) is obtained. Accordingly, when the condition (B) is satisfied, the loss in quantity of light of the fly's eye lens 5 due to the spread of light source 1 along the optical axis becomes constant regardless of the angle $u_1$ indicating the direction of emission, and the illumination efficiency becomes maximum. Therefore, without using a light source 1 of highly increased power, the illumination region can be illuminated with high efficiency and with high illuminance, thereby achieving power saving and extending the life of light source 1.

Next, to determine the two constants in the function $g(u_2)$, the following two conditions are imposed as boundary conditions.

$$g(u_{2max}) = R_{max} \qquad (28\text{-}1)$$
$$g(u_2 \to 0) \to 0 \qquad (28\text{-}2)$$

The latter equation (28-2) means that the function $g(u_2)$ approaches 0 as the angle $u_2$ becomes closer to 0. With the above boundary conditions, the constants $C_1$ and $C_2$ in equation (27) are determined as follows.

$$C_1 = 2R_{max}\{(\beta^2-1) \cos u_{2max}-(\beta^2+1)\}/\{(\beta^2-1)(\cos u_{2max}-1)\} \qquad (29\text{-}1)$$

$$C_2 = R_{max}\{(\beta^2-1) \cos u_{2max}-(\beta^2+1)\}/\{(\beta^2-1)(\cos u_{2max}-1)\} \qquad (29\text{-}2)$$

Now employing a new constant defined by the following equation:

$$C = R_{max}\{(\beta^2-1) \cos u_{2max}-(\beta^2+1)\}/\{(\beta^2-1)(\cos u_{2max}-1)\} \qquad (30\text{-}1),$$

an aimed solution of the function $g(u_2)$ is as follows.

$$g(u_2) = 2C/\{(\beta^2-1) \cos u_2-(\beta^2+1)\} + C \qquad (30\text{-}2)$$

Differentiating this equation (30-2), the following equation is obtained.

$$g'(u_2)=2C(\beta^2-1)\sin u_2/\{(\beta^2-1)\cos u_2-(\beta^2+1)\}^2 \qquad (31)$$

Substituting this equation (31) into equation (24), the following equation is attained.

$$S(u_2)/dz_1=2\beta^2/C(\beta^2-1) \qquad (32)$$

Then, defining a numerical aperture $NA_f$ of a secondary light source image taken without a loss in quantity of light by the optical integrator 5 consisting of a fly's eye lens by the following equation:

$$mx,y/2f_F=NA_f \qquad (33),$$

the range of a spread $\delta z_1$ of the light source along the optical axis, taken without a loss in quantity of light, is given by the following equation.

$$|\delta z_1|\leq NA_fC(\beta^2-1)/2\beta^2 \qquad (34)$$

In this case, the right side of equation (34) becomes as follows from equation (30-1).

the right side $=NA_fR_{max}\{(\beta^2-1)\cos u_{2max}-(\beta^2+1)\}/\{2\beta^2(\cos u_{2max}-1)\}$ (35-1)

Also, letting Mx,y be the length of one side of the illumination region 8 by the condenser lens 7, the right side of equation (34) becomes as follows using equation (1), equation (2), equation (33), and equation (12-3).

The right side $=(\frac{1}{2})Mx,y\cdot NA_{ill}/(1-\cos u_{1max})$ (35-2)

Accordingly, the light from the light source with the spread $\delta z_1$ satisfying the following relation can pass through the fly's eye lens without any loss in quantity of light.

$$4\sin^2(u_{1max}/2)|\delta z_1|\leq Mx,y\cdot NA_{ill} \qquad (36)$$

The projection relation (30-2) which the collimator lens 3A needs to satisfy has a permissible range of about ±5%. Thus, a satisfactory effect can be achieved if the following relation is satisfied:

$$0.95T\leq R\leq 1.05T$$

where $T=2C/\{(\beta^2-1)\cos u_2-(\beta^2+1)\}+C$.

If the angle $u_2$ of the light emitted from the first focal point $F_1$ is limited within a narrow range, another form of function to be satisfied by the collimator lens 3A can be obtained with appropriate approximation (for example, approximation to a linear function) in equation (23). For example, a rightward-descending curve in the range of $50°\leq u_1\leq 130°$ in FIG. 7 can be approximated to a straight line (linear function). This approximation can facilitate the designing of collimator lens 3A.

Further, there would be cases where the approximation to linear function would rather be more effective than the above equation (23) if the lateral spread of the light source to the optical axis is taken into consideration.

Described in the following is an embodiment in which the present invention is applied to an illumination optical system in a semiconductor exposure apparatus.

Figure 5:
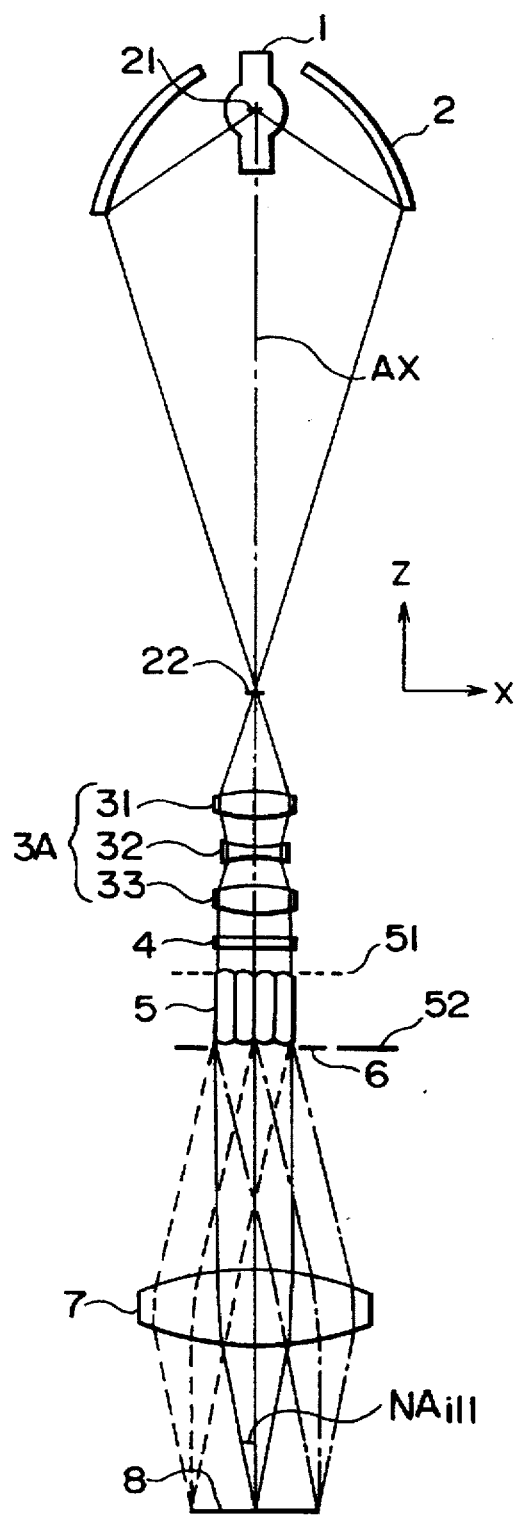
FIG. 5 is a drawing to show the structure of embodiment 1 of the illumination optical apparatus according to the present invention.

FIG. 5 shows the illumination optical apparatus in the present embodiment. In FIG. 5, the mercury lamp 1 as a light source is located at the first focal point 21 of the ellipsoidal surface of revolution of the collector mirror 2 and a light source image (secondary light source) is formed at the second focal point 22 of the ellipsoidal surface of revolution. Light beams diverging from the secondary light source are converted into nearly parallel beams by the collimator lens 3A of focal length $f_{col}$ composed of a convex lens 31, a concave lens 32, and a convex lens 33. Here, at least one surface of at least one lens out of the three lenses 31, 32, and 33 in the collimator lens 3A is aspherical, satisfying the above-described condition (A) or condition (B) outside the sine condition. By the arrangement that at least one surface of the lenses (31 to 33) constituting the collimator lens 3A is made aspherical, the number of lens elements in the collimator lens 3A for satisfying the condition (A) or condition (B) can be made smaller.

The nearly parallel beams collimated by the collimator lens 3A are let to enter the band-pass filter 4, so that illumination light of an exposure wavelength (g-line, i-line, or the like) selected by the band-pass filter 4 is incident into the fly's eye lens 5 to form a lot of light source images (tertiary light sources) on the exit focal plane 52 of fly's eye lens 5. The aperture stop 6 of aperture diameter $2R_{max}$ is set on the focal plane 52, and beams diverging from the numerous tertiary light sources in the aperture stop 6 are condensed by the condenser lens 7 of focal length $f_c$ to illuminate the illumination region 8 on reticle in a superimposed manner and with uniform illuminance. The numerical aperture of the illumination optical system is let to be $NA_{ill}$, and similarly as in FIG. 1, the Z-axis is taken in parallel with the optical axis AX and the XY plane is a plane perpendicular to the Z-axis.

Figure 13:
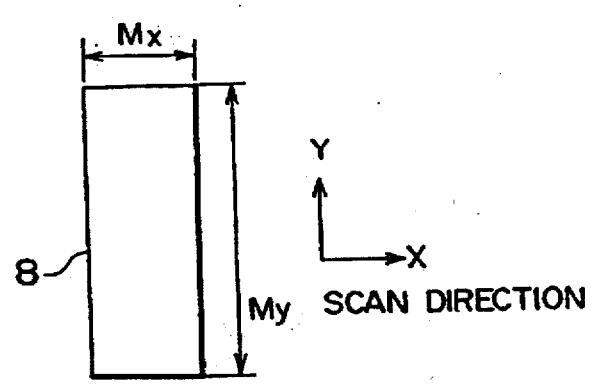
FIG. 13 is a drawing to show the shape of illumination region 8 in embodiment 1 of the present invention shown in FIG. 5.
Figure 14:
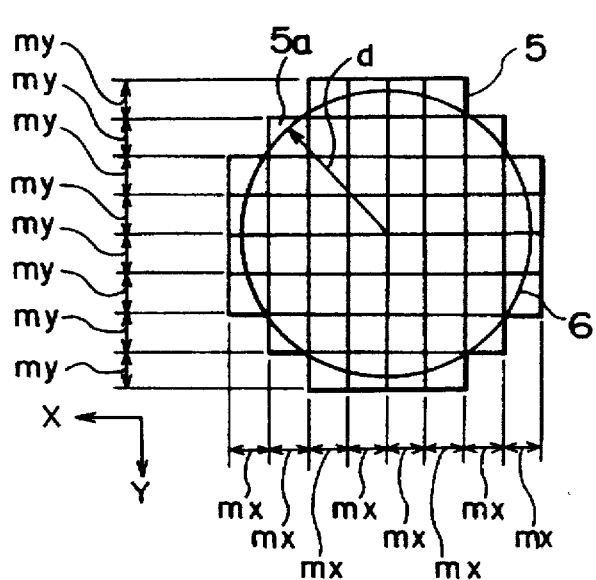
FIG. 14 is a drawing as seen along the optical axis, of the fly's eye lens 5 in the conventional illumination optical apparatus shown in FIG. 1.
Figure 15:
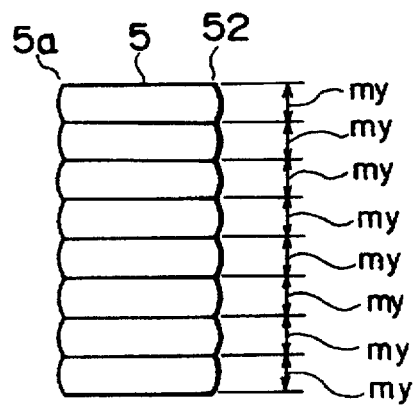
FIG. 15 is a side view of the fly's eye lens 5 in the conventional illumination optical apparatus shown in FIG. 1.

The exposure apparatus of the present embodiment is an exposure apparatus of the step-and-scan type or slit scan type, and the illumination region 8 is rectangular so that the X-directional length Mx is considerably smaller than the Y-directional length My, as shown in FIG. 13. Then the reticle is scanned relative to the illumination region 8 in the X direction. Also, in FIG. 5, because the entrance focal plane 51 of fly's eye lens 5 is conjugate with the illumination region 8, the aspect ratio of illumination region 8 is equal to that of the cross section of each lens element in the fly's eye lens 5.

Figure 11:
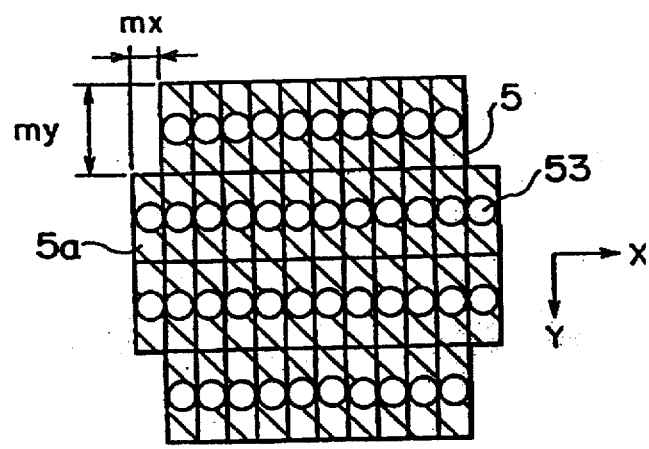
FIG. 11 is a drawing as seen along the optical axis, of the fly's eye lens 5 in embodiment 1 of the present invention shown in FIG. 5.

FIG. 11 is a view along the Z direction, of the fly's eye lens 5 in the present embodiment. As seen, the X-directional length mx of each of lens elements 5a constituting the fly's eye lens 5 is considerably smaller than the Y-directional length my. Here, the relation of mx:my=Mx:My holds.

As shown in FIG. 11, the beams collimated by the collimator lens 3A shown in the present embodiment are effectively captured by the fly's eye lens 5 without a loss in quantity of light. Moreover, a plurality of light source images 53 formed on the exit side of lens elements 5a in the fly's eye lens 5 each are formed in the size with a diameter equivalent to the transverse length of each lens element 5a. It is thus understood that even if the illumination region 8 is rectangular, the quantity of light is effectively utilized without causing any loss in quantity of light.

Here, let $f_F$ be the focal length of lens elements 5a. Values of the parameters in the present embodiment are given as follows:

Mx=30 (mm), My=120 (mm), $NA_{ill}$=0.1, $f_c$=250 (mm), $2R_{max}$=50 (mm), mx=2.5 (mm), my=10 (mm), $f_F$=20.83(mm).

Also, as shown in FIG. 6, let $f_1$ and $f_2$ be distances from the vertex O of the ellipsoidal surface of revolution 2a of the collector mirror 2 to the first focal point $F_1$ and to the second focal point $F_2$, respectively, and the paraxial lateral magnification $\beta$ be $f_2/f_1$. Further, supposing the center of the emission arc of mercury lamp 1 in FIG. 5 is set at the first focal point $F_1$, let $u_2$ be an angle which the light emitted at the angle $u_1$ relative to the optical axis AX from the center of the emission arc makes with the optical axis AX after reflected by the ellipsoidal surface of revolution 2a toward the second focal point $F_2$. In the present embodiment, values of the paraxial lateral magnification β and angle u1 (or $u_2$) are as follows.

$$\beta=15,$$

$$50°\leq u_1 \leq 120° (3.56° \leq u_2 \leq 16.27°)$$

Also, in FIG. 6, suppose one end of the emission arc having the center at the first focal point $F_1$ is located at a position shifted $dz_1$ along the optical axis AX. When $\delta z_1$ is a maximum value of the deviation amount $dz_1$ light from which can pass through the fly's eye lens 5 without a loss in quantity of light, it is to be desired that the maximum value $\delta z_1$ becomes as large as possible. The light emitted from the position of the deviation amount $dz_1$ has a deviation dy at the second focal point $F_2$ in the direction perpendicular to the optical axis AX. Thus, the lateral spread magnification B is defined as $dy_2/dz_1$.

In order to compare the present embodiment with the conventional technology, comparison is next made between a case where the collimator lens 3A is designed by the conventional method and a case where the collimator lens 3A is designed based on equation (30-2) related to the condition (B).

(1) The case where the collimator lens 3A is designed by the conventional method:

In this case, because the collimator lens 3A satisfies the sine condition, the image height of the light incident at the maximum incident angle $u_{2max}$ into the collimator lens 3A (the maximum radius of collimated light) is $f_{col} \sin u_{2max}$, which becomes equal to the aperture radius $R_{max}$ of the aperture stop 6. Thus, the following relation holds.

$$f_{col} \sin 16.27° = 25 \text{ (mm)} \quad (37)$$

Accordingly, the focal length $f_{col}$ is given as follows.

$$f_{col} = 89.2 \text{ (mm)} \quad (37)$$

Further, calculating the lateral spread magnification B using equation (14), the maximum value thereof is obtained as follows.

$$|B|_{max} = 9.8$$

Also, the following relation is satisfied by the maximum value $\delta z_1$ of the deviation amount at the first focal point $F_1$, of beams which can pass through the fly's eye lens 5 without a loss in quantity of light.

$$|\delta z_1| \times 9.8 \times \sin 16.27° \leq (50/2) \times 1.25/20.83 \quad (38)$$

Accordingly, the following relation is obtained.

$$|\delta z_1| 0.55 \text{ (mm)} \quad (39)$$

(2) The case where the collimator lens 3A is designed based on equation (30-2):

In this case, the following relation holds for the maximum value $\delta z_1$ of the deviation amount from equation (36).

$$4 \sin^2 (130°/2)|\delta z_1| \leq 30 \times 0.1 \quad (40)$$

Accordingly, the following relation is obtained.

$$|\delta z_1| \leq 0.91 \text{ (mm)} \quad (41)$$

Figure 12:
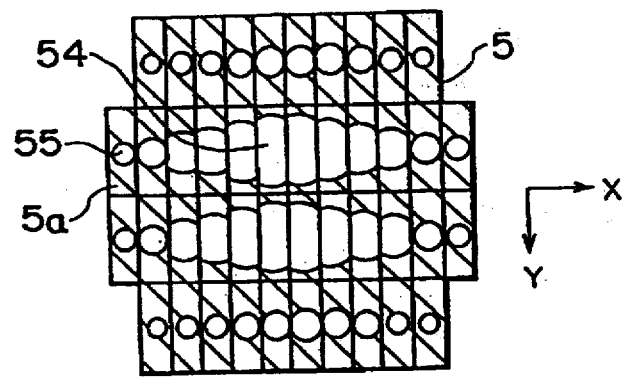
FIG. 12 is a drawing as seen along the optical axis, of the fly's eye lens 5 when a conventional collimator lens 3 is used in the conventional illumination optical apparatus shown in FIG. 1.

Comparing this with equation (39), it is seen that $|\delta z_1|$, which is the length of emission arc of mercury lamp 1 capable of being captured without a loss in quantity of light, is considerably broadened in the present embodiment. Specifically, when the collimator lens 3A is designed by the conventional method, the light source images formed on the exit plane of fly's eye lens 5 are like those 54 to 55 in FIG. 12, having larger eclipses in the central portion of fly's eye lens 5. In contrast, when the collimator lens 3A is designed by the method of the present embodiment, the light source images formed on the exit plane of fly's eye lens 5 are nearly uniform light source images 53 shown in FIG. 11, having no eclipse and thus having an increased illumination efficiency.

The present embodiment is so arranged that the collimator lens 3A is located behind the second focal point 22 of the collector mirror 2 in FIG. 5, but the embodiment may be modified in such a manner that a collimator lens with negative refracting power is provided on the light source side before the second focal point 22 so as to satisfy the condition (A) or the condition (B). In another modification, the collimator lens of the present invention satisfying the condition (A) or the condition (B) may be constructed of lenses arranged before and after the second light source near the second focal point 22. Another modification may be such that the second light source is once relayed and the collimator lens satisfying the condition (A) or the condition (B) is arranged for relayed beams.

According to the present invention, where a narrow illumination region or a small numerical aperture is given as specifications of illumination optical system, the collimator lens satisfying the condition (A) outside the sine condition is used, thereby having an advantage that the illumination region can be illuminated with high illumination efficiency and with high illuminance. Accordingly, there is no need to use a light source of highly increased power, the life of the light source can be extended, and the reliability can be improved when mounted in a semiconductor exposure apparatus or the like.

An example of the narrow illumination region is an elongate, rectangular (slit) illumination region, for example, used in the scan type exposure apparatus.

When the condition (B) is further satisfied, the illumination efficiency becomes maximum.

Further, when the collimator lens has a lens element at least one surface of which is aspherical, the number of lens elements constituting the collimator lens can be made smaller.

Embodiment 2

Next described is embodiment 2 of the illumination optical apparatus according to the present invention.

The principle is first described.

Figure 16:
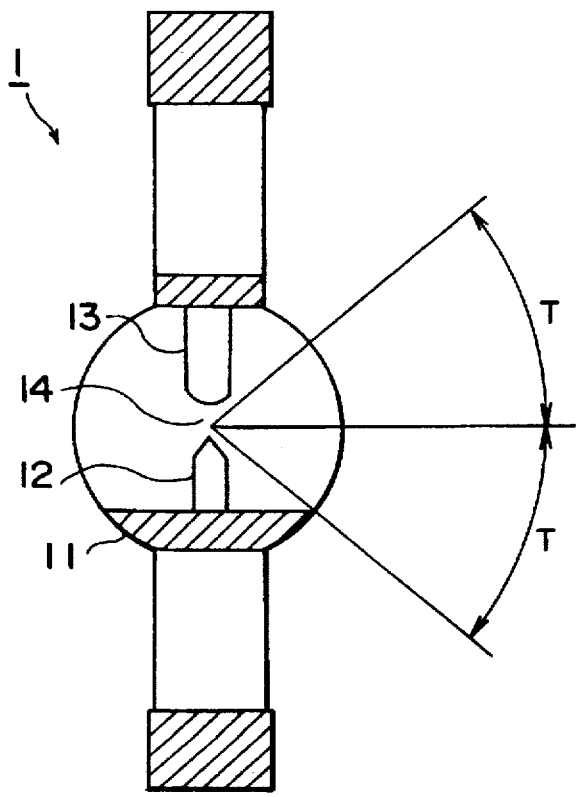
FIG. 16 is an enlarged drawing to show a mercury lamp 1.

The mercury lamp 1 shown in FIG. 16 is used as a light source. The mercury lamp 1 emits light distributed in the range of ±T approximately in symmetry about the direction of angle $u_1=90°$ (i.e., the horizontal direction).

Figure 18:
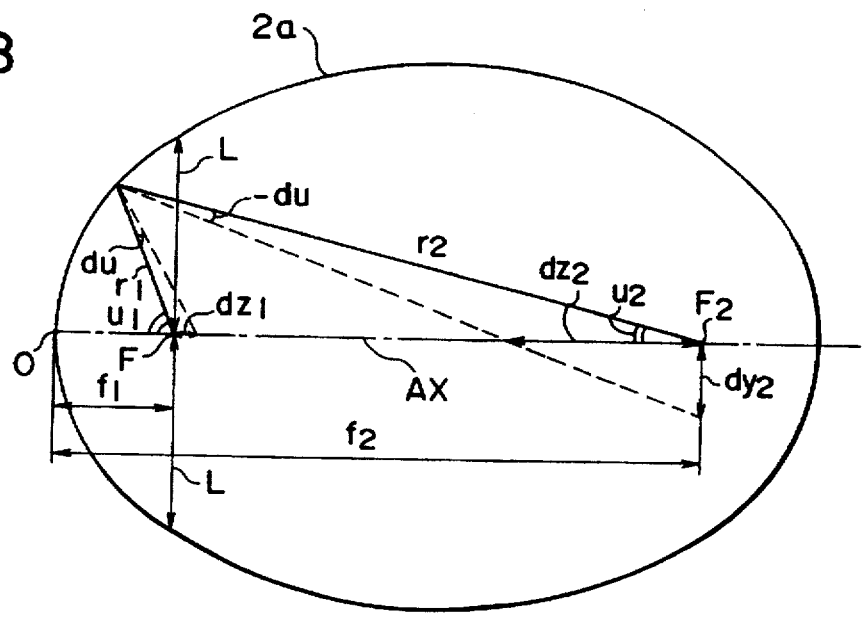
FIG. 18 is a drawing to illustrate imaging characteristics of an ellipsoidal surface of revolution $2a$ of a collector mirror 2 shown in FIG. 17.

A maximum value $|B_{max}|$ of an absolute value $|B|$ of the lateral spread magnification in the emission distribution determines a spread of the light source image at the second focal point $F_2$ of the ellipsoidal surface of revolution of the collector mirror 2. Also, $\sin u_{2max}$ appearing in the inequality (9) is defined using the value $u_{2max}$ of angle $u_2$ given when the angle $u_1$ in FIG. 18 takes a maximum value $u_{1max}$, which is given by the following equation from equation (12-4).

$$\sin u_{2max} = 2\beta \sin u_{1max}/\{(\beta^2+1)+(\beta^2-1)\cos u_{1max}\} \quad (42)$$

Figure 19:
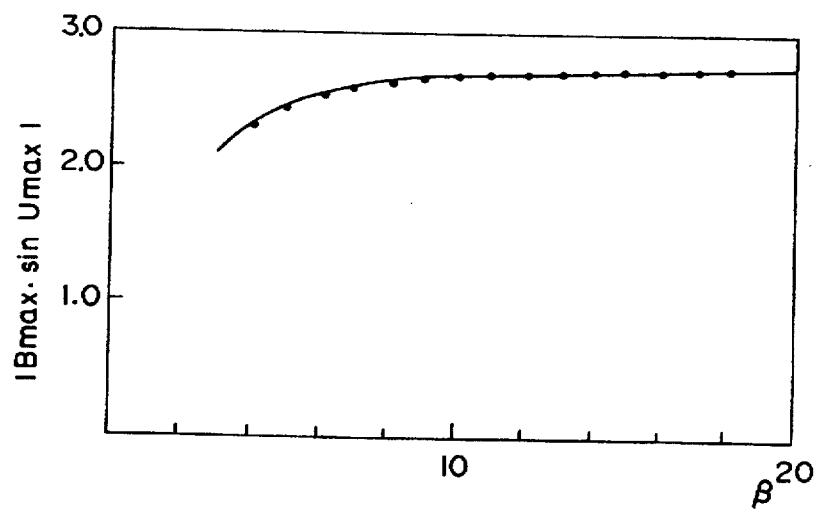
FIG. 19 is a drawing to show a relation of $|B_{max} \cdot \sin u_{2max}|$ against paraxial lateral magnification $\beta$.

FIG. 19 shows calculation results of $|B_{max} \cdot \sin u_{2max}|$ where the mercury lamp 1 of FIG. 16 is used as a light source and the spread angle T of emission light from the mercury lamp 1 is typically 40° ($u_1=50°$ to 130°). In FIG. 19, the horizontal axis represents the paraxial lateral magnification $\beta$ (=$f_2/f_1$). Since $|B_{max}\cdot\sin u_{2max}|$ decreases as the value of paraxial lateral magnification $\beta$ decreases, there is a possibility that the illumination efficiency can be improved only by selection of the paraxial lateral magnification $\beta$. However, decreasing the paraxial lateral magnification $\beta$ would cause the following problems.

Figure 20:
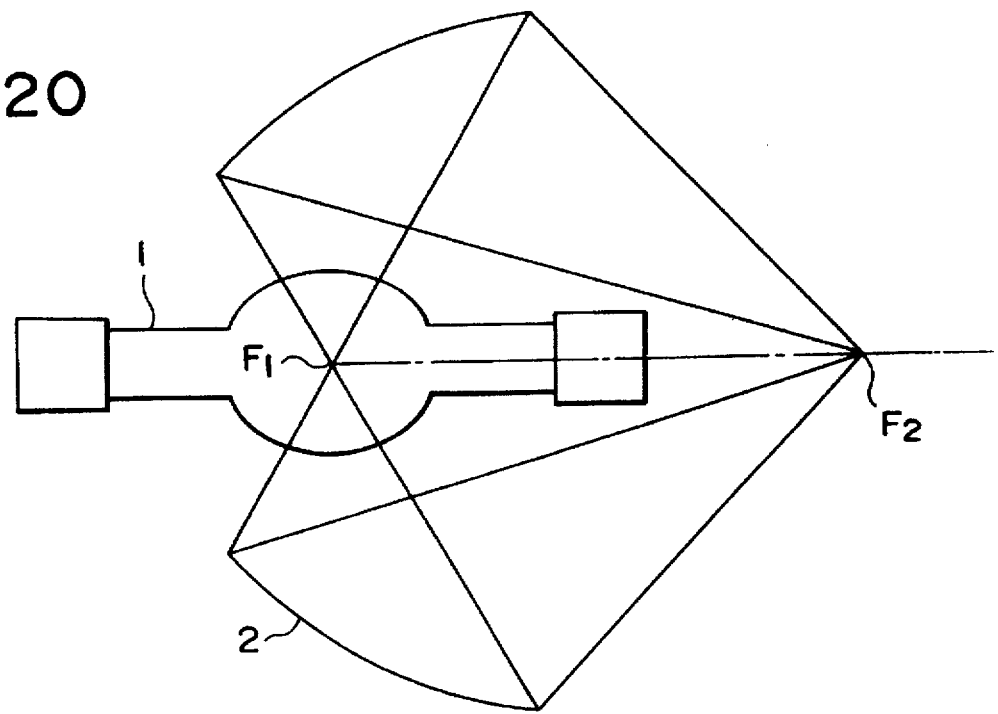
FIG. 20 is a drawing to show an example of a way of locating the mercury lamp 1 relative to the collector mirror 2.

(1) Since the outer shape of the mercury lamp 1 is actually considerably large as shown in FIG. 20, the inner diameter of the collector mirror 2 needs to be considerably large in order to set the mercury lamp 1 inside the collector mirror 2 so as to locate the center of emission arc at the first focal point $F_1$ of the collector mirror 2.

(2) The angle of incidence into the collimating optical system 3 becomes very large, which makes designing of the collimating optical system 3 difficult.

The present invention is based on such an arrangement that a correction optical system 9 is added to the collector mirror 2 having a practical paraxial lateral magnification $\beta$, not causing the above problems, so as to minimize the physical amount corresponding to $|B_{max}\cdot\sin u_{2max}|$ thus satisfying the inequality (9).

Figure 21:
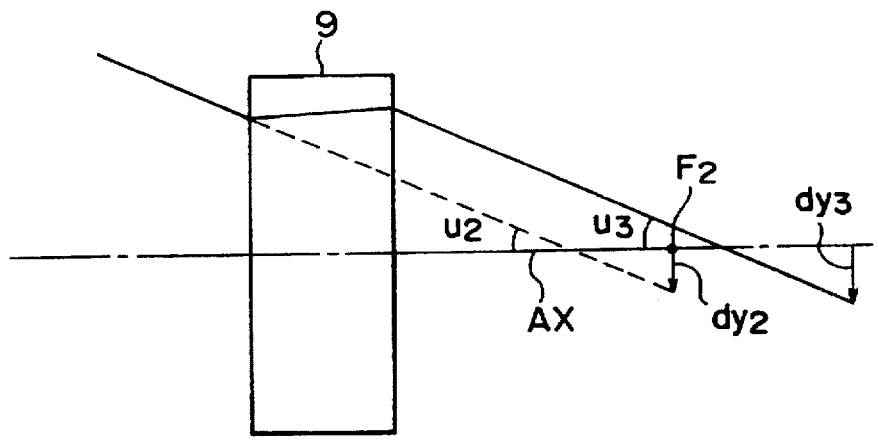
FIG. 21 is a drawing to illustrate the function of correction optical system 9.

FIG. 21 shows the function of the correction optical system 9 in the present invention. As shown in FIG. 21, suppose that a lateral infinitesimal change $dy_2$ of the light source image at the second focal point $F_2$ by the ellipsoidal surface of revolution 2a (FIG. 18) of the collector mirror is transformed into an infinitesimal change $dy_3$ by the correction optical system 9. Letting $u_2$ be an angle which light traveling toward an image of the infinitesimal change $dy_2$ makes with the optical axis AX and $u_3$ be an angle which light traveling toward an image of the infinitesimal change $dy_3$ makes with the optical axis AX, the following relation holds between the infinitesimal changes $dy_2$ and $dy_3$.

$$dy_2 \cos u_2 du_2 = dy_3 \cos u_3 du_3 \quad (43\text{-}1)$$

Accordingly, the following equation holds.

$$(dy_2/dz_1) \cos u_2 du_2 = (dy_3/dz_1) \cos u_3 du_3 \quad (43\text{-}2)$$

Differentiating the both sides of equation (12-3), the following equation is obtained.

$$-\sin u_2 du_2 = 4\beta^2 \sin u_1 du_1 / \{(\beta^2+1)+(\beta^2-1) \cos u_2\}^2 \quad (44\text{-}1)$$

Substituting equation (12-4) into the above equation, the following equation is obtained.

$$du_2 = 2\beta du_1 / \{(\beta^2+1)+(\beta^2-1) \cos u_1\} \quad (44\text{-}2)$$

Substituting equation (14) and equation (44-2) into equation (43-2), the following equation holds.

$$-\sin u_1 du_1 = (dy_3/dz_1) \cos u_3 du_3 \quad (45)$$

Figure 22:
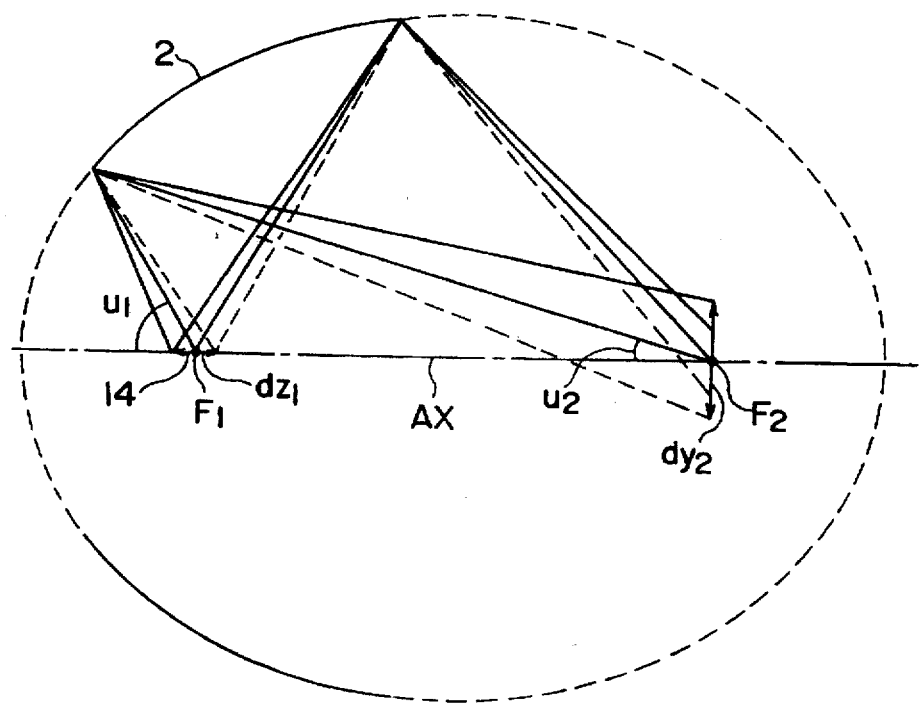
FIG. 22 is an optical path diagram to show a focused state of a light source image when only the collector mirror 2 is used.
Figure 23:
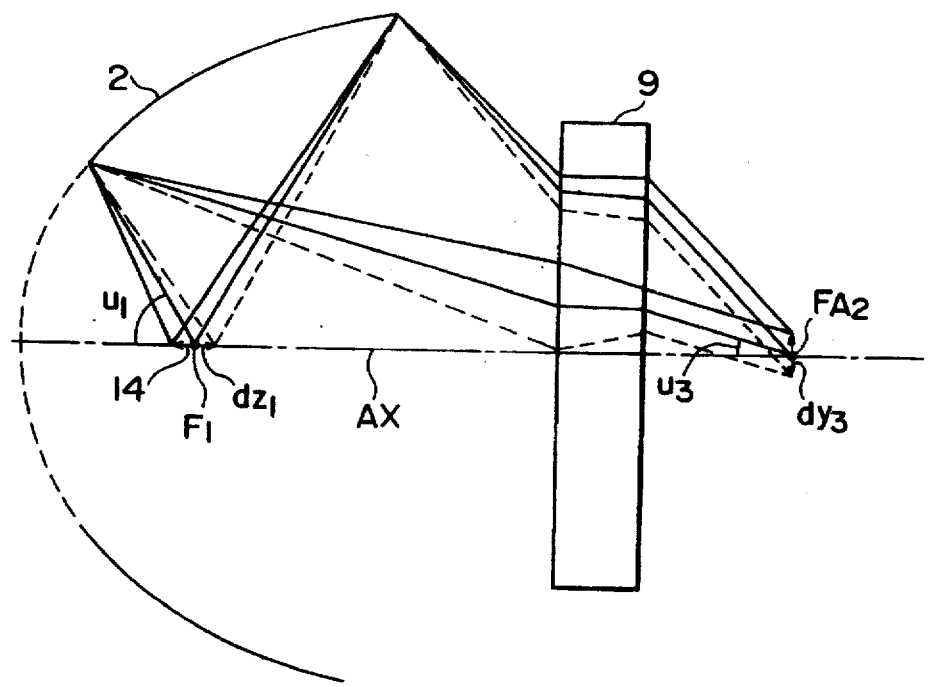
FIG. 23 is an optical path diagram to show a focused state of a light source image when both collector mirror 2 and correction optical system 9 are used.

Here, let us consider a case where the projection relation of $(dy_3/dz_1)=C_1$(constant) holds. In connection with this, only with the collector mirror 2 having the ellipsoidal surface of revolution, the light from a light-emitting portion 14 extending in the length $2dz_1$ along the optical axis with the center at the first focal point $F_1$ is projected in a lateral region of $2dy_2$ on the plane perpendicular to the optical axis AX and passing the second focal point $F_2$, as shown in FIG. 22. In contrast, where the projection relation of $(dy_3/dz_1)=C_1$ (constant) holds, the light from the light-emitting portion 14 extending in the length $2dz_1$ along the optical axis with the center at the first focal point $F_1$ is projected without aberration by the correction optical system 9 into a lateral region of length $2dy_3$ on the plane perpendicular to the optical axis AX and passing an imaging point $FA_2$, as shown in FIG. 23. In other words, in FIG. 23, the light from the light-emitting portion displaced by $dz_1$ along the optical axis from the first focal point $F_1$ is projected without aberration by the correction optical system 9 at a position $dy_3$ displaced in the lateral direction perpendicular to the optical axis AX from the imaging point $FA_2$. When this projection relation holds, integrating equation (45) and using another constant $C_2$, the following equation is obtained.

$$\cos u_1 = C_1 \cdot \sin u_3 + C_2 \quad (46\text{-}1)$$

Also, changing the constants $C_1$, $C_2$ as $1/C_1 \to C_1$ and as $-C_2/C_1 \to C_2$, the above equation can be rewritten as follows.

$$\sin u_3 = C_1 \cdot \cos u_1 + C_2 \quad (46\text{-}2)$$

This is the previously described condition (C). When this condition (C) is satisfied, the light from the light source having the light-emitting portion extending in a predetermined length along the optical axis and passing the first focal point $F_1$ of the collector mirror 2 is focused without aberration by the correction optical system 9 to form the light source image (secondary light source) extending in a predetermined length along the direction perpendicular to the optical axis AX and passing the imaging point $FA_2$ on the optical axis AX, as shown in FIG. 23. Decreasing the size of the light source image also decreases the image height corresponding to the size dy of the light source image in the left side of the inequality (9) and keeps the angle corresponding to the maximum angle $u_{2max}$ not so large. Therefore, even with use of a narrow illumination region or even with a small illumination numerical aperture, a body to be illuminated can be illuminated with high illumination efficiency and with high illuminance.

Next, in order to obtain a more specific form of equation (46-1), a condition that $u_2=0$ when $u_1=0$ is employed as a boundary condition, resulting in $C_2=1$. Then renaming the constant $C_1$ as a constant C, equation (46-1) is rewritten as follows.

$$\cos u_1 = C \sin u_3 + 1 \quad (46\text{-}2)$$

If the correction optical system is not an optical element having such a smooth curve as a lens but an optical system including a conic (circular cone) glass member or the like, for example, another boundary condition should be chosen. In equation (46-2) the constant C (=$C_1$) means $(dy_3/dz_1)$, where $dz_1$ can be regarded as a constant. Consequently, when equation (46-2) holds, the equation for determining the illumination efficiency in correspondence with the left side of the inequality (9) can be expressed by the product $|C \cdot \sin u_{3max}|$, where $u_{3max}$ is a maximum value of angle $u_3$ which the light traveling toward the imaging point $FA_2$ makes with the optical axis AX in FIG. 23. This product $|C \cdot \sin u_{3max}|$ becomes as follows.

$$|C \cdot \sin u_{3max}| = |\cos u_{1max} - 1| \quad (46\text{-}3)$$

The value of this equation (46-3) is determined only by the maximum value $u_{1max}$ of angle $u_1$ irrespective of selection of the paraxial lateral magnification $\beta$ of the ellipsoidal surface of revolution of the collector mirror 2.

Setting $u_{1max}=130°$, similarly as in the case using only the collector mirror 2 as described previously, the value of equation (46-3) becomes as follows.

$$|C \cdot \sin u_{3max}| = 1.64 \quad (46\text{-}4)$$

In contrast, the value of product $|B_{max} \cdot \sin u_{2max}|$, which indicates the illumination efficiency for the case using only the collector mirror 2 having the ellipsoidal surface of revolution, becomes as follows with practical paraxial lateral magnification β, as seen from FIG. 19.

$$|B_{max} \cdot \sin u_{2max}| = 2.7 \qquad (46\text{-}5)$$

It is thus understood that the present invention can greatly improve the illumination efficiency as compared with the case using only the collector mirror 2.

Next, because the following relation holds from equation (12-3):

$$\cos u_1 = \{(\beta^2-1)-(\beta^2+1)\cos u_2\}/\{(\beta^2-1)\cos u_2-(\beta^2+1)\} \qquad (47),$$

the correction optical system 9 of FIG. 23 needs to be an optical system to satisfy the following relation between the angle of incidence $u_2$ (FIG. 22) and an angle of exit $u_3$.

$$\sin u_3 = (1/C) \cdot 2\beta^2 (1-\cos u_2)/\{(\beta^2-1)\cos u_2-(\beta^2+1)\} \qquad (48)$$

Although the constant C is arbitrary, let us take such a constant as to make $u_{3max} = u_{2max}$, for example. In this case, the maximum angle of divergence is the same as that in the case using only the collector mirror 2 having the ellipsoidal surface of revolution, and only inside angles of divergence are changed. Then the value of constant C is given by the following equation from equation (46-2).

$$C = (\cos u_{1max}-1)/\sin u_{2max} \qquad (49\text{-}1)$$

Thus, the constant C is given as follows from equation (42).

$$C = (\cos u_{1max}-1)\{(\beta^2+1)+(\beta^2-1)\cos u_{1max}\}/(2\beta \sin u_{1max}) \qquad (49\text{-}2)$$

As seen from this equation (49-2), the constant C (i.e., constant $C_1$) takes a negative value. When the correction optical system 9 having the projection relation obtained by substituting this constant C into equation (46-2) is combined with the collector mirror 2 having the ellipsoidal surface of revolution, illumination with high efficiency can be achieved without using a light source of highly increased power, especially in illumination with a narrow illumination region or with a small illumination numerical aperture.

It is noted that a satisfactory effect can be expected not only by the exact solution given by equation (46-2') but also by correction within the range of ± about 5% of the exact solution.

Described in the following is an embodiment in which the present invention is applied to an illumination optical system in a semiconductor exposure apparatus.

Figure 17:
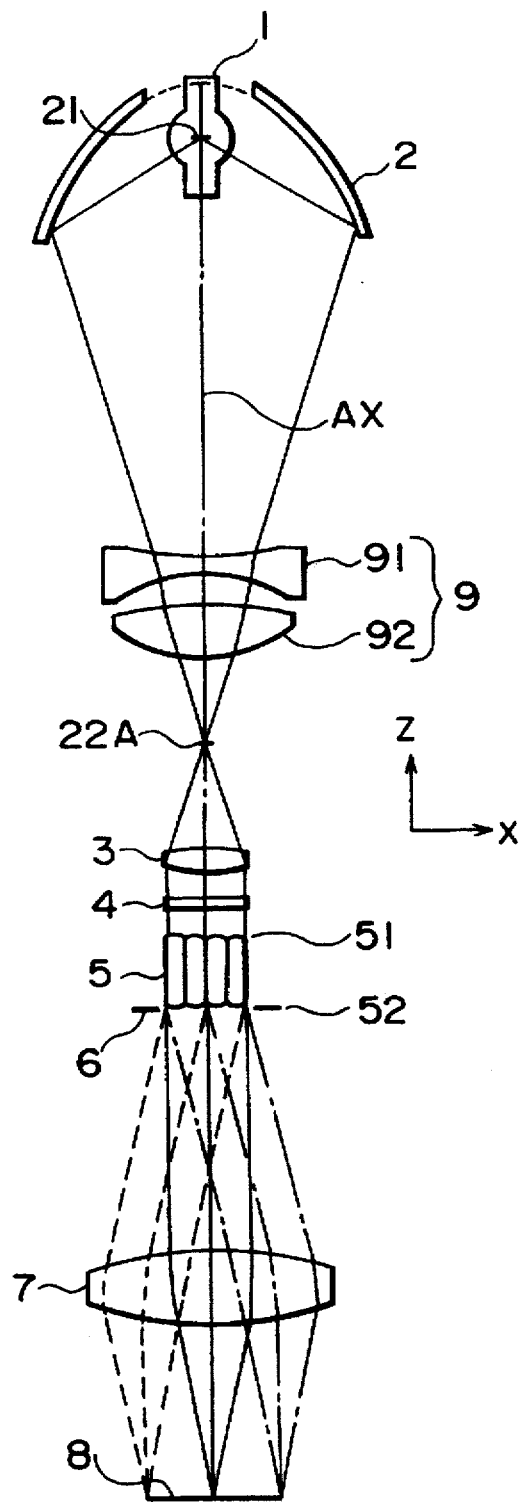
FIG. 17 is a drawing to show the structure of embodiment 2 of the illumination optical apparatus according to the present invention.

FIG. 17 shows the illumination optical apparatus in the present embodiment. In FIG. 17, a light-emitting portion of short line (i.e., emission arc 14 of FIG. 16) of the mercury lamp 1 as a light source is located along the optical axis AX with the center at the first focal point 21 of the ellipsoidal surface of revolution of the collector mirror 2. Light emitted from the light-emitting portion of the mercury lamp 1 is reflected and collected by the ellipsoidal surface of revolution of the collector mirror 2 and then passes through the correction optical system 9 to form an image (secondary light source) of the light-emitting portion on the plane perpendicular to the optical axis AX and passing the imaging point 22A on the optical axis AX. This imaging point 22A is different from the second focal point (second focal point 22 in FIG. 1) of the ellipsoidal surface of revolution of the collector mirror 2. As in FIG. 1, the Z-axis is taken in parallel with the optical axis AX and the plane perpendicular to the Z-axis is the XY plane.

The correction optical system 9 is constructed of two aspherical lenses 91 and 92 arranged along the optical axis AX in this order from the mercury lamp 1. The both surfaces of each of the aspherical lenses 91 and 92 are aspherical. These aspherical surfaces each can be expressed by the following equation (50) where the height along the direction perpendicular to the optical axis AX is y, a displacement amount along the optical axis at the height y and from a tangent plane to the surface at the vertex of aspherical surface is $S(y)$, a reference radius of curvature is R, a conical coefficient is k, and aspherical coefficients of the n-th order (n=2, 4, 6, . . . ) are $C_n$.

$$S(y) = (y^2/R)/\{1+(1-k \cdot y^2/R^2)^{1/2}\} + C_2 \cdot y^2 + C_4 \cdot y^4 + C_6 \cdot y^6 + C_8 \cdot y^8 + C_{10} \cdot y^{10} + \ldots \qquad (50)$$

Also, the paraxial radius of curvature $R_0$ of aspherical surface can be expressed as follows.

$$R_0 = 1/(2 \cdot C_2 + 1/R) \qquad (51)$$

Next described referring to FIG. 23 are imaging characteristics of the correction optical system 9 in the present embodiment.

FIG. 23 shows an enlarged view of the optical system from the mercury lamp 1 to the correction optical system 9 in FIG. 17. In FIG. 23, the emission arc 14 of the mercury lamp 1 in FIG. 17 is see with the center at the first focal point $F_1$ (which is the same as the first focal point 21 in FIG. 17) of the ellipsoidal surface of revolution of the collector mirror 2. The emission arc 14 is arranged to extend in the length $2dz_1$ along the optical axis AX, so that the light emitted from the first focal point $F_1$ at the angle $u_1$ relative to the optical axis AX passes through the correction optical system 9 then to be incident at the angle $u_3$ relative to the optical axis AX into the imaging point $FA_2$ (which is the same as the imaging point 22A in FIG. 17) on the optical axis AX.

In this case, the correction optical system 9 has imaging characteristics to satisfy the condition (C), i.e., equation (46-1) between the angle of divergence $u_1$ and the angle of incidence $u_3$. Since the present embodiment satisfies such a boundary condition that when the angle of divergence $u_1$ is 0, the angle of incidence $u_3$ is also 0, equation (46-2) can be used instead of equation (46-1). Then, letting $u_{1max}$ be a maximum value of the angle Of divergence $u_1$ and using the paraxial lateral magnification β (=$f_2/f_1$, FIG. 18) of the ellipsoidal surface of revolution of the collector mirror 2, the constant C in equation (46-2) is expressed by equation (49-2). Accordingly, the shape of each aspherical surface of the two aspherical lenses 91 and 92 in the correction optical system 9 can be determined to satisfy equation (46-2). Using the aspherical lenses as described, the correction optical system 9 satisfying equation (46-2) can be constructed of a smaller number of lenses.

As so arranged, in FIG. 23, the light emitted from the emission arc 14 passes through the correction optical system 9 so as to be focused without aberration on the plane perpendicular to the optical axis AX and passing the imaging point $FA_2$ on the optical axis AX to form a light source image (secondary light source) extending in the length $2dy_3$ with the center at the imaging point $FA_2$. When the constant $C=(dy_3/dz_1)$ and the range of the angle of divergence $u_1$ is from 50° to 130°, the maximum value $u_{1max}$ of the angle of divergence $u_1$ becomes 130°. Thus, the value of $|C \cdot \sin u_{1max}|$ of the present embodiment corresponding to the left side of the inequality (9) is given by equation (46-4), which is considerably smaller than equation (46-5) for the case using only the collector mirror 2. Accordingly, the illumination efficiency is greatly improved.

Returning to FIG. 17, beams diverging from the light source image (secondary light source) formed in the perpendicular plane at the imaging point 22A are collimated into nearly parallel beams by the collimator lens 4 and thereafter the collimated beams pass through the band-pass filter 4 into the fly's eye lens 5 to form a lot of light source images (tertiary light sources) on the exit focal plane 52 of the fly's eye lens 5. Beams diverging from the numerous tertiary light sources within the aperture in the aperture stop 6 located on the focal plane 52 are condensed by the condenser lens 7 to illuminate the illumination region 8 on reticle in a superimposed manner and with uniform illuminance. Since the illumination efficiency at the imaging point 22A is improved in the present embodiment, the entire illumination region 8 can be illuminated in a high illuminance distribution without a need to use a mercury lamp 1 of especially highly increased power, for example, even if the illumination region 8 is of a slit extending in the X direction or in the Y direction (in a direction perpendicular to the plane of FIG. 17). Further, even if an unusually small value is required as an illumination numerical aperture $NA_{ill}$, the entire illumination region 8 can be illuminated in a high illuminance distribution without a need to use a mercury lamp 1 of especially highly increased power.

Although the above embodiment is so arranged that the correction optical system 9 is constructed only of the refracting lenses, the correction optical system 9 may be constructed of a reflecting system or of a catadioptric system.

It is thus noted that the present invention is by no means limited to the above embodiments but may involve various arrangements within the range not departing from the scope or essence of the present invention. According to the present invention, the correction optical system is provided for forming a real image of the light source in the plane perpendicular to the optical axis of the collector mirror, whereby the quantity corresponding to the left side of the inequality (9) can be made smaller. Accordingly, the invention has such an advantage that without a need to use a light source of highly increased power, a body to be illuminated can be illuminated with high illumination efficiency and with high illuminance even in the case of illumination in an especially narrow illumination region or even in the case of illumination with a small illumination numerical aperture.

When the condition (C) is satisfied, a body to be illuminated can be illuminated with higher illumination efficiency.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 5-280789 filed on Nov. 10, 1993 and 5-306266 filed on Dec. 7, 1993 are hereby incorporated by reference.

What is claimed is:

1. An illumination optical apparatus comprising:
   a collector mirror having an ellipsoidal surface of revolution;
   a light source located at one focal point of said ellipsoidal surface of revolution so that light emitted therefrom is reflected and collected by said collector mirror;
   a collimator lens for converting light collected by said collector mirror into substantially parallel beams;
   an optical integrator for producing a plurality of light source images, based on the beams outgoing from said collimator optical system; and
   a condenser lens for condensing light from said plurality of light source images to illuminate an object to be illuminated in a superimposed manner;
   wherein said collimator lens satisfies the following relation:

$R_{max} < f_{col} \cdot \sin u_{max}$ where $f_{col}$ is a focal length of said collimator lens, $u_{max}$ a maximum angle of incidence of the light incident into said collimator lens, and $R_{max}$ a maximum beam radius of the substantially parallel beams outgoing from said collimator lens.

2. An illumination optical apparatus according to claim 1, wherein at least one surface of said collimator lens is aspherical.

3. An illumination optical apparatus comprising: a collector mirror having an ellipsoidal surface of revolution;
   a light source located at one focal point of said ellipsoidal surface of revolution so that light emitted therefrom is reflected and collected by said collector mirror;
   a collimator lens for converting light collected by said collector mirror into substantially parallel beams;
   an optical integrator for producing a plurality of light source images, based on the beams outgoing from said collimator lens; and
   a condenser optical system for condensing light from said plurality of light source images to illuminate an object to be illuminated in a superimposed manner;
   wherein said collimator lens satisfies the following projection relation:

$0.95T \leq R \leq 1.05T$ where $T = 2C/\{(\beta^2-1)\cos u_2 - (\beta^2+1)\} + C;$ where $C = R_{max}\{(\beta^2-1)\cos u_{max} - (\beta^2+1)\}/\{(\beta^2-1)(\cos u_{max}-1)\};$ where $\beta = f_2/f_1;$ where $f_1$ and $f_2$ ($f_1 < f_2$) are distances from the vertex of said ellipsoidal surface of revolution to either of two focal points of said ellipsoidal surface of revolution, R a collimating radius of said collimator lens, $R_{max}$ a maximum collimating radius, $u_2$ an angle of incidence into said collimator lens, and $u_{max}$ a maximum angle of incidence.

4. An illumination optical apparatus according to claim 3, wherein at least one surface of said collimator lens is aspherical.

5. An illumination optical apparatus comprising:
   a collector mirror with an optical axis having an ellipsoidal surface of revolution;
   a light source located at a first focal point of said ellipsoidal surface of revolution so that light emitted therefrom is reflected and collected by said collector mirror;
   a correction optical system being set as coaxially with the optical axis of said collector mirror at a position between said collector mirror and a second focal point of said collector mirror, said correction optical system being arranged to form a real image of said light source; and an illumination optical system for receiving light collected by said collector mirror and illuminating an object to be illuminated, wherein said correction optical system comprises an optical element at least one surface of which satisfies the equation:

$$S(y)=(y^2/R)/\{1+(1-k\cdot y^2/R^2)^{1/2}\}+C_2\cdot y^2+C_4\cdot y^4+C_6\cdot y^6+C_8\cdot y^8+C_{10}\cdot y^{10}+\cdots,$$

wherein height along the direction perpendicular to the optical axis is y, a displacement amount along the optical axis at the height y and from a tangent plane to said one surface at a vertex of said one surface is S(y), a reference radius of curvature is R, a conical coefficient is k, and aspherical coefficients of the n-th order (n=2, 4, 6, . . . ) are Cn.

6. An illumination optical apparatus according to claim 5, further comprising:

an optical integrator for producing a plurality of light source images, based on light collected by said collector mirror; and a condenser optical system for condensing light from said plurality of light source images to illuminate said object to be illuminated in a superimposed manner.

7. An illumination optical apparatus according to claim 6, further comprising a collimator lens disposed between said correction optical system and said optical integrator, for converting light collected by said collector mirror into substantially parallel beams.

8. An illumination optical apparatus comprising:

a collector mirror with an optical axis having an ellipsoidal surface of revolution;

a light source located at a first focal point of said ellipsoidal surface of revolution os that light emitted therefrom is reflected and collected by said collector mirror;

a correction optical system being set as coaxially kith the optical axis of said collector mirror at a position between said collector mirror and a second focal point of said collector mirror, said correction optical system being arranged to form a real image of said light source, wherein said correction optical system satisfies the following relation:

$$0.95\cdot(C_1\cdot\cos u_1+C_2)\leq \sin u_3[u_2]\leq 1.05\cdot(C_1\cdot\cos u_1+C_2)$$

where $u_1$ ($u_1\neq 0$) is an angle between a direction of light impinging on said ellipsoidal surface of revolution from said light source and the optical axis of said collector mirror, $u_3$ ($u_3\neq 0$) an angle between a direction of light outgoing from said correction optical system and the optical axis of said collector mirror, and $C_1$ ($C_1<0$) and $C_2$ are properly chosen constants.

9. An illumination optical apparatus according to claim 8, further comprising:

an optical integrator for producing a plurality of light source images, based on light source images, based on light collected by said collector mirror; and a condenser optical system for condensing light from said plurality of light source images to illuminate said object to be illuminated in a superimposed manner.

10. An illumination optical apparatus according to claim 8, further comprising a collimator lens disposed between said correction optical system and said optical integrator, for converting light collected by said collector mirror into substantially parallel beams.

* * * * *